United States Patent
Watanabe et al.

(10) Patent No.: US 7,081,277 B1
(45) Date of Patent: Jul. 25, 2006

(54) MAGNETIC DISK DRIVE HAVING A SURFACE COATING ON A MAGNETIC DISK

(75) Inventors: Keiji Watanabe, Kawasaki (JP); Hiroshi Chiba, Higashine (JP); Eishin Yamakawa, Higashine (JP); Tsukasa Itani, Kawasaki (JP); Norikazu Nakamura, Kawasaki (JP); Shoichi Suda, Kawasaki (JP); Masayuki Takeda, Kawasaki (JP); Kazuaki Kurihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/692,569

(22) Filed: Oct. 19, 2000

(30) Foreign Application Priority Data

| Oct. 22, 1999 | (JP) | ................................. 11-301349 |
| Nov. 2, 1999 | (JP) | ................................. 11-312728 |
| Nov. 26, 1999 | (JP) | ................................. 11-336458 |

(51) Int. Cl.
  *G11B 5/65* (2006.01)
  *C08F 2/46* (2006.01)
(52) U.S. Cl. ...................... 427/493; 427/502; 427/508; 427/558; 428/835.6
(58) Field of Classification Search ............... 428/65.5, 428/408, 694 TC; 360/97.01, 135
See application file for complete search history.

(56) References Cited

U.S. PATENT DOCUMENTS

| 4,705,699 | A | * | 11/1987 | Burguette et al. ........... 427/487 |
| 4,755,426 | A | * | 7/1988 | Kokai et al. ................ 428/336 |
| 4,861,662 | A | * | 8/1989 | Kobliska et al. ............ 428/408 |
| 5,409,738 | A | * | 4/1995 | Matsunuma et al. ........ 427/502 |
| 5,614,314 | A | * | 3/1997 | Itoh et al. .................... 428/332 |
| 5,637,393 | A | * | 6/1997 | Ueda et al. ................. 428/332 |
| 5,698,272 | A | * | 12/1997 | Smentkowski et al. ..... 427/551 |
| 5,747,550 | A | * | 5/1998 | Nohr et al. ................... 522/34 |
| 5,765,275 | A | * | 6/1998 | Obara ..................... 360/97.01 |
| 5,776,602 | A | * | 7/1998 | Ueda et al. ................. 428/332 |
| 5,891,530 | A | * | 4/1999 | Wright ....................... 427/515 |
| 5,932,393 | A | * | 8/1999 | Cunningham et al. ... 430/281.1 |
| 6,045,864 | A | * | 4/2000 | Lyons et al. ........... 427/255.23 |
| 6,096,385 | A | * | 8/2000 | Yong et al. ................. 427/510 |
| 6,204,504 | B1 | * | 3/2001 | Lewis ........................ 250/365 |
| 6,489,081 | B1 | * | 12/2002 | Matsumoto et al. ..... 430/281.1 |
| 6,589,641 | B1 | * | 7/2003 | Stirniman et al. .......... 428/216 |

FOREIGN PATENT DOCUMENTS

JP 2027521 1/1990

* cited by examiner

*Primary Examiner*—Kevin M. Bernatz
(74) *Attorney, Agent, or Firm*—Greer, Burns & Crain, Ltd.

(57) ABSTRACT

A magnetic disk is produced with improved yield by forming a DLC protective film by a d.c. magnetron sputtering process conducted in a sputtering atmosphere containing oxygen. The magnetic disk carries a lubricating film on the DLC film wherein a fluorocarbon resin constituting the lubricating film contains photocrosslinking groups. A lubricating film having non-polar end groups is also disclosed.

19 Claims, 16 Drawing Sheets

MAGNETIC DISK DRIVE HAVING A SURFACE COATING ON A MAGNETIC DISK

CROSS-REFERENCE TO RELATED APPLICATION

The present application is based on Japanese priority applications No.11-301349, 11-312728 and 11-336458 respectively filed on Oct. 22, 2000, Nov. 2, 2000 and Nov. 26, 2000, the entire contents of which are hereby incorporated by reference.

BACKGROUND OF THE INVENTION

The present invention generally relates to magnetic recording of information and more particularly to a magnetic disk apparatus called hard disk drive and a surface coating provided on a magnetic disk used in such a hard disk drive.

Hard disk drives are used extensively in various computers as a large-capacity, high-speed auxiliary storage device.

A typical hard disk drive includes a rigid magnetic disk rotated at a high speed and a magnetic head held on a swing arm so as to scan the recording surface of the magnetic disk, wherein the magnetic head scans the recording surface at a high speed generally in a radial direction of the magnetic disk response to the rotational movement of the swing arm. The magnetic disk is usually rotated at a speed of several thousand r.p.m. and the magnetic head carries out reading or writing of information in the state that the magnetic head is floated from the surface of the magnetic disk by a minute distance.

A typical hard disk drive includes a plurality of magnetic disks mounted coaxially on a common drive hub and the swing arm and the magnetic head are provided for each magnetic disk. The swing arms corresponding to the magnetic disks are mounted on a common drive shaft in the form of a unitary body, and the magnetic heads on the respective swing arms scan the surface of the corresponding magnetic disk simultaneously in response to the rotation of the drive shaft.

FIG. 1 shows the internal structure of a typical hard disk drive in a plan view, wherein the left side of the broken line shows the hard disk drive in a state wherein the upper cover is removed, while the right side of the broken line shows the construction of a magnetic disk 11 and an arm assembly 12 that cooperates with the disk 11, wherein the magnetic disk 11 and the arm assembly 12 form a part of a magnetic disk assembly 10 in which a plurality of magnetic disks are stacked with each other.

Referring to FIG. 1, each magnetic disk 11 is mounted upon a hub 11a that is driven by a motor not illustrated, and the arm assembly 12 includes a swing arm 12b held on a swing axle 12a and a magnetic head 12c provided on a free end of the arm 12b. Further, a coil 12d that forms a part of a voice coil motor 13 is provided on the arm 12b in correspondence to another free end, opposite to the first free end on which the magnetic head 12c is provided, wherein the coil 12d is wound parallel to the scanning surface of the arm 12b. Further, magnets 13a and 13b forming another part of the voice coil motor 13 are disposed above and below the coil 12d. Thereby, the arm 12 is rotated about the swing axle 12a freely in response to the energization of the coil 12d. The voice coil motor 13 is subjected to a servo control such that the magnetic head 12c carried on the arm 12b properly tracks a cylinder or track 11b that is defined on the magnetic disk 11.

FIG. 2 is a perspective view showing the internal structure of the hard disk drive of FIG. 1.

Referring to FIG. 2, the magnetic disk assembly 10 includes a plurality of magnetic disks $11_1$, $11_2$, . . . that are held commonly on the rotary hub 11a, and the arm assembly 12 includes a plurality of arms corresponding to the plurality of magnetic disks. Each arm 12b is held on a common rotatable member 12e that in turn is held rotatable about the swing axle 12a, and all the arms 12b are swung simultaneously in response to the rotational motion of the member 12e. Of course, the member 12e is activated in response to the energization of the voice coil motor 13. Further, the entire structure of the hard disk device is accommodated within a sealed envelope 1.

FIG. 3 shows the cross-sectional structure of the magnetic disk 11.

Referring to FIG. 3, the magnetic disk 11 is formed on a substrate 11A of Al, and the like, and includes a foundation layer 11B typically of NiP formed on the substrate 11A with a thickness of about 10 μm, a Cr layer 11C formed on the foundation layer 11B with a thickness of about 300 nm, and a magnetic film 11D of a Co alloy formed on the Cr foundation layer 11C with a thickness of about 300 nm, wherein the magnetic film 11D holds written information in the form of magnetization.

Further, the surface of the magnetic film 11D thus formed on the magnetic disk 11 is protected against damages caused by a physical contact of the magnetic head 12c as in the case of head crashing event, by providing a hard carbon film 11E on the surface of the magnetic film 11D, wherein the hard carbon film 11E is formed with a thickness of about 10 nm and has a diamond-like structure. Thus, the hard carbon film 11E is called a DLC (diamond-like carbon) film.

The hard carbon film 11E thus formed is further covered by a lubricating film 11F with a thickness of about 2 nm, wherein the lubricating film 11F is typically formed of a fluorocarbon resin and is provided so as to reduce the friction between the magnetic head 12c and the magnetic disk 11. By providing the lubricating film 11F, damaging of the magnetic film 11D at the time of contact-start-stop operation of the hard disk drive, and the like, is minimized.

In the actual magnetic disk, the layered structure of FIG. 3 is formed not only on the topside of the magnetic disk 11 but also on the bottom side thereof.

Conventionally, it is practiced to form the DLC film 11E by a sputtering process that uses a graphite target. In order to achieve a high deposition rate at the time of the deposition of the DLC film 11E, it is commonly practiced to use a high-density d.c. magnetron sputtering process for the sputter deposition of the DLC film 11E. In such a conventional d.c. magnetron sputtering process of the DLC film 11E, it is further practiced to add a gas containing hydrogen such as $H_2$ or $CH_4$ to the sputtering gas, typically of Ar, so as to terminate the dangling bonds in the DLC film 11E. By doing so, it is possible to form the DLC film 11E in the form of an insulating film.

FIG. 4 shows the construction of a d.c. magnetron sputtering apparatus 20.

Referring to FIG. 4, the d.c. magnetron sputtering apparatus 20 includes a processing chamber 21 evacuated at an evacuation port 21A, wherein the processing chamber 21 accommodates therein a substrate 22 to be processed.

In the processing chamber 21, there is provided a graphite target 23A and a graphite target 23B such that the graphite target 23A faces a top surface of the substrate 22 and the graphite target 23B cases a bottom surface of the substrate 22.

Above the processing chamber 21, there is provided a magnet 25A centrally to the graphite target 23A in the state that the N-pole of the magnet 25A faces the graphite target 23A. Further, an annular magnet 26A is provided at the top part of the processing chamber 21 in the state that the S-pole of the magnet 26A faces the graphite target 23A, wherein the magnet 26A is provided so as to surround the central magnet 25A.

Similarly, a magnet 25B is provided on the bottom part of the processing chamber 21 in the state that the N-pole of the magnet 25B faces the graphite target 23B. Further, an annular magnet 26B is provided around the central magnet 25B with such an orientation that the S-pole of the magnet 26B faces the graphite target 23B.

The processing chamber 21 is supplied with a mixed gas of Ar and $CH_4$ via a mass-flow controller 24A and a line 24B, and a plasma 28A is formed in the processing chamber 21 adjacent to the target 23A by supplying a d.c. power from a d.c. power source 27A to the target 23A. Similarly, a plasma 28B is formed in the processing chamber 21 adjacent to the target 23B by supplying a d.c. power from a d.c. power source 27B to the target 23B.

The plasma 28A thus formed acts upon the surface of the graphite target 23A and the sputtered C atoms are deposited on the top surface of the substrate 22 to form a DLC film corresponding to the DLC film 11E. Similarly, the plasma 28B acts upon the surface of the graphite target 23B and the sputtered C atoms are deposited on the bottom surface of the substrate 22 to form a DLC film corresponding to the DLC film 11E.

In such a d.c. magnetron sputtering apparatus, it is possible to form a ring-shaped plasma region of high plasma density in the plasma 28A by disposing the magnet 26A around the magnet 25A, wherein the sputtering process is promoted in such a high-density plasma region and the deposition of the DLC film on the top surface of the substrate 11E is facilitated. Similarly, it is possible to form a ring-shaped plasma region of high plasma density in the plasma 28B by disposing the magnet 26B around the magnet 25B, and the deposition of the DLC film on the bottom surface of the substrate 22 is facilitated.

On the other hand, the inventor of the present invention has discovered a problem in such a d.c. magnetron sputtering process of the DLC film that uses a ring-shaped high-density plasma in that deposition of a DLC film or a similar structure occurs not on the substrate 22 but on the graphite target 23A or 23B in the central part where the plasma density is low. It is believed that such a DLC film covers uniformly on the surface of the target 23A or 23B at the beginning but is removed as a result of sputtering in the ring-shaped region where the plasma density is high. Thus, in such a ring-shaped region of the target 23A or 23B, exposure of the fresh target surface is maintained.

It should be noted that the DLC film thus deposited on the central part of the target 23A or 23B is an insulating film and easily causes charge-up as a result of contact with the plasma 28A or 28B. Thereby, the DLC film tends to cause scattering in the processing chamber 21 and forms exotic fragments on the surface of the substrate 22. Thereby, the yield of the DLC film on the substrate 22 is reduced.

In the magnetic disk 11 of FIG. 3, the lubricating film 11F performs an important function of reducing friction between the magnetic disk surface and the slider surface of the magnetic head as noted before. It should be noted that the slider surface of the magnetic head makes a direct contact with the magnetic disk 11 in the contact-start-stop operation of the magnetic disk drive. In view of the fact that the magnetic disk drive is used in various environmental conditions, it is required that the lubricating film 11F functions as an effective lubrication layer over a wide range of temperature and/or moisture condition. The importance of the lubricating film 11F is increasing further in recent magnetic disk drives having increased recording density characterized by a very narrow gap between the magnetic disk surface and the magnetic head. With regard to the lubricating film 11F, reference should be made to the U.S. Pat. No. 3,778,308, U.S. Pat. No. 4,267,238 and the U.S. Pat. No. 4, 268, 556.

Conventionally, a perfluoro resin compound having a highly polar group such as OH group or COOH group as the endcap group has been used for the lubricating film 11F. In such a lubricating film 11F of perfluoro resin compound, the polar end group of the perfluoro-resin compound functions to cause adherence or bonding of the lubricating layer 11F on the underlying surface of the hard carbon film 11E.

On the other hand, such a conventional lubricating film 11F using conventional perfluoro resin compound encounters a problem in that, while the bottom part of the lubricating film 11F is thus bonded firmly upon the surface of the underlying hard carbon film 11E, the upper part of the lubrication film 11F is not bonded and forms a mobile component that can move freely over the surface of the hard carbon film 11E and hence the surface of the magnetic disk 11.

Thus, there is a tendency that the mobile component of the lubricating film 11F is displaced in the radial direction of the magnetic disk 11 toward the peripheral edge thereof as a result of the centrifugal force caused by the high-speed rotation of the magnetic disk. The mobile component thus displaced is accumulated at the peripheral part of the magnetic disk and increases the disk thickness of the peripheral part at the magnetic disk 11.

Thus, the existence of such a mobile component causes a serious problem particularly in recent high-recording-density magnetic disk drives in which the air gap formed between the magnetic disk surface and the magnetic head is reduced and the rotational speed of the magnetic disk is increased.

In order to reduce the proportion of the mobile component, it is necessary increase the proportion of the bonded component in the lubricating film 11F, and it has been proposed to form the lubricating film 11F immediately after the formation of the hard carbon film 11E such that the lubricating film 11F causes a reaction with the reactive surface of the hard carbon film 11E. However, the reactive surface of the hard carbon film 11E adsorbs a large amount of impurities in the air within a short time after formation of the hard carbon film 11E. Thus, such a process has been not effective for reducing the mobile component.

Further, it has been proposed to activate the surface of the hard carbon film 11E by a plasma process as disclosed in the Japanese Laid-Open Patent Publications 62-150226 and 63-2117, or by irradiating ozone ultraviolet radiation as taught in the Japanese Laid Open Publications 4-6624 and 6-301970. However, there still remains difficulty to increase the proportion of the bonded layer in the lubricating film 11F in the magnetic disk of FIG. 3.

Further, it has been proposed in the Japanese Laid-Open Patent Publication 7-262555 and 8-124142 to induce a reaction in the lubricating film 11F to cause a bonding with the underlying hard carbon film 11E by applying optical radiation to the lubricating film 11F after deposition on the hard carbon film 11E such that optically excited electrons form radicals that facilitates the bonding reaction of the lubricating film 11F upon the hard carbon film 11E.

However, such a process is effective only after optical exposure conducted for a long period of time and the throughput of production of the magnetic disk drive is deteriorated substantially. Further, there is a risk in such an optical radiation process in that the surface of the lubricating film 11F may be oxidized as a prolonged optical exposure. When such oxidation is caused, the friction at the surface of the lubricating film 11F may be increased. Further, such optical processing is conducted in the air and the chance that impurities in the air contaminate the lubricating film 11F. When such contamination is caused, there is a possibility that the impurities on the lubricating film 11F may act as nuclei of water drop condensation and the water drops act to collect further impurities in the form of condensates. Thereby, the condensates may cause the problem of increased drive torque of the magnetic disk due to increased friction and further various problems such as contamination of the magnetic head, deterioration of floating of the magnetic head, corrosion of the magnetic head, and the like.

SUMMARY OF THE INVENTION

Accordingly, it is a general object of the present invention to provide a novel and useful magnetic disk and a magnetic disk drive wherein the foregoing problems are eliminated.

Another and more specific object of the present invention is to provide a magnetic disk protected by a high-quality DLC film and a magnetic disk drive using such a magnetic disk.

Another object of the present invention is to provide method of producing a magnetic disk having an improved high-quality DLC protective film.

Another object of the present invention is to provide a magnetic disk drive, comprising:

a magnetic disk carrying a magnetic film, said magnetic disk being rotatable about a rotational axis;

a motor causing said magnetic disk to rotate about said rotational axis;

a swing arm pivoted on a pivot axis so as to scan a surface of said magnetic disk generally in a radial direction thereof; and a magnetic head provided on said swing arm, said magnetic disk carrying thereon a carbon film so as to cover said magnetic film, wherein said carbon film contains therein oxygen atoms such that said oxygen atoms form any of an ether bonding or a carbonyl bonding with carbon atoms constituting said carbon film.

Another object of the present invention is to provide a magnetic disk drive, comprising:

a magnetic disk carrying a magnetic film, said magnetic disk being rotatable about a rotational axis;

a motor causing said magnetic disk to rotate about said rotational axis;

a swing arm pivoted on a pivot axis so as to scan a surface of said magnetic disk generally in a radial direction thereof; and a magnetic head provided on said swing arm, said magnetic disk carrying thereon a carbon film so as to cover said magnetic film, wherein said carbon film contains therein oxygen atoms and nitrogen atoms.

Another object of the present invention is to provide a magnetic disk comprising:

a substrate;

a magnetic film formed on said substrate; and a carbon film covering said magnetic film, said carbon film containing therein oxygen atoms such that said oxygen atoms form any of an ether bonding or carbonyl bonding with carbon atoms constituting said carbon film.

Another object of the present invention is to provide a magnetic disk, comprising:

a substrate;

a magnetic film formed on said substrate; and a carbon film covering said magnetic film, said carbon film containing therein oxygen atoms and nitrogen atoms.

Another object of the present invention is to provide a method of making a magnetic disk, comprising the steps of:

depositing a magnetic film on a substrate; and depositing a carbon film on said magnetic film, said step of depositing said carbon film is conducted in a plasma atmosphere containing an inert gas and oxygen.

According to the present invention, any insulating carbon film formed on the surface of a carbon sputter target during a sputtering process of the carbon film on the magnetic disk is effectively removed by admixing oxygen into the plasma atmosphere. As a result, the problem of the carbon film on the sputter target surface causing a scattering to the magnetic disk surface as a result of charge-up during the sputtering process is eliminated and the yield of production of the magnetic disk is improved substantially. The carbon film thus formed on the magnetic disk is a DLC film and has a characteristic feature of containing oxygen atoms in the form of either ether bonding or carbonyl bonding with the carbon atoms that constitute the carbon film. In the case the sputtering atmosphere contains oxygen and nitrogen, the DLC film thus formed contains oxygen atoms and nitrogen atoms. In order to prevent excessive decrease of the deposition rate of the carbon film on the magnetic disk, it is preferable to control the oxygen concentration in the sputtering atmosphere such that the carbon film contains oxygen atoms in the range of 0.1–7%.

Another object of the present invention is to provide a magnetic disk having an improved lubricating film and a magnetic disk drive using such a magnetic disk.

Another object of the present invention is to provide a method of producing an improved lubricating film of a magnetic disk.

Another object of the present invention is to provide a magnetic disk drive comprising:

a rotary magnetic disk;

a magnetic head scanning a surface of said rotary magnetic disk in a state that said magnetic head is floated form said surface of said rotary magnetic disk;

an arm carrying said magnetic head; and a drive mechanism driving said arm, wherein said magnetic disk carries a lubricating film containing therein a photocrosslinking functional group, said photocrosslinking functional group causing a crosslinking in said lubricating film.

Another object of the present invention is to provide a method of producing a magnetic disk, comprising the steps of:

coating a disk surface with a lubricating layer comprising molecules having a photocrosslinking functional group;

causing a photocrosslinking in said molecules by applying an optical radiation to said lubricating layer.

Another object of the present invention is to provide an apparatus for producing a magnetic disk, comprising:

a disk holder adapted to hold a magnetic disk coated with a lubricating film;

a processing chamber accommodating said disk holder, said processing chamber applying a processing to said magnetic disk held on said disk holder;

a far-ultraviolet optical radiation source provided in said processing chamber so as to irradiate said lubricating film on said magnetic disk with an optical radiation in the state that said magnetic disk is held in said disk holder; and a heat source provided in said processing chamber so as to heat said magnetic disk in the state that said magnetic disk is held in said disk holder, wherein said far-ultraviolet source produces a monochromatic ultraviolet radiation characterized by a half-width height of 15 nm or less.

According to the present invention, it becomes possible to reduce the proportion of the mobile components in the lubricating film on the surface of the magnetic disk by using a lubricating material containing a photocrosslinking functional group and causing the lubricating material to form a gel, after applying the lubricating material on the surface of the magnetic disk to form the lubricating film, such that a photocrosslinking reaction takes place in the molecules of the lubricating film. Such a crosslinking reaction is caused as a result of exposure of the lubricating film to the optical radiation having a wavelength corresponding to the absorption wavelength of the photocrosslinking functional group. As a result of the photocrosslinking reaction, the proportion of the freely moving mobile component is reduced in the lubrication film, and the problem of the mobile component moving toward the peripheral part of the rotating magnetic disk to build up a thick lubrication layer in such a peripheral part of the disk is effectively eliminated. Thereby, the problem of head crashing is eliminated even in such a case the air gap between the magnetic disk surface and the magnetic head is reduced for high-density recording of information.

Another object of the present invention is to provide a fluorocarbon resin composition having, as an endcap group, a tri-organosilyl group not causing hydrolysis or dehydration condensation, represented by a general formula

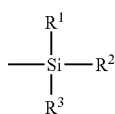

(1)

wherein $R^1$, $R^2$, $R^3$ represent independently or commonly any of an alkyl group, an aryl group and an aralkyl group, including those substituted with halogen or nitrogen.

Another object of the present invention is to provide a method of forming a fluorocarbon resin having an endcap group represented by a formula

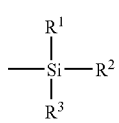

(2)

($R^1$, $R^2$, $R^3$ represent independently or commonly any of an alkyl group, an aryl group and an aralkyl group, including those substituted with halogen or nitrogen), said method comprising the step of:

silylzing a fluorocarbon resin having OH at an end gap group by any of chlorosilane, silylamine and silylamide.

Another object of the present invention is to provide a fluorocarbon resin having an endcap group represented by a formula

(3)

wherein $R^4$, $R^5$ and $R^6$ represent commonly or independently a hydrogen atom or an organic group, at least one of said groups $R^4$–$R^6$ being an organic group), said endcap group having eight or more π electrons.

According to the present invention, a lubricating film having a high bonding rate to an underlying magnetic disk surface is obtained by using a fluorocarbon resin without using polar endcap groups in the lubricating film. Because of elimination of the use of polar endcap groups, the problem of coagulation, which tends to occur in the conventional lubricating film that uses polar endcap groups in the resin, is effectively eliminated. In order to achieve a strong adherence to the underlying disk surface, the present invention uses non-polar endcap groups such that the endcap groups contain π electrons. Preferably, the non-polar endcap group contains at least eight π electrons. Because of the improved bonding rate, the lubricating film remains on the surface of the magnetic disk without lateral displacement, even in such a case the magnetic disk is rotated at a high speed. Further, the lubricating film thus formed effectively reduces the friction of the surface of the magnetic disk.

Other objects and further features of the present invention will become apparent from the following detailed description when read in conjunction with the attached drawings.

DETAILED DESCRIPTION OF THE INVENTION

FIRST EMBODIMENT

Figure 5:
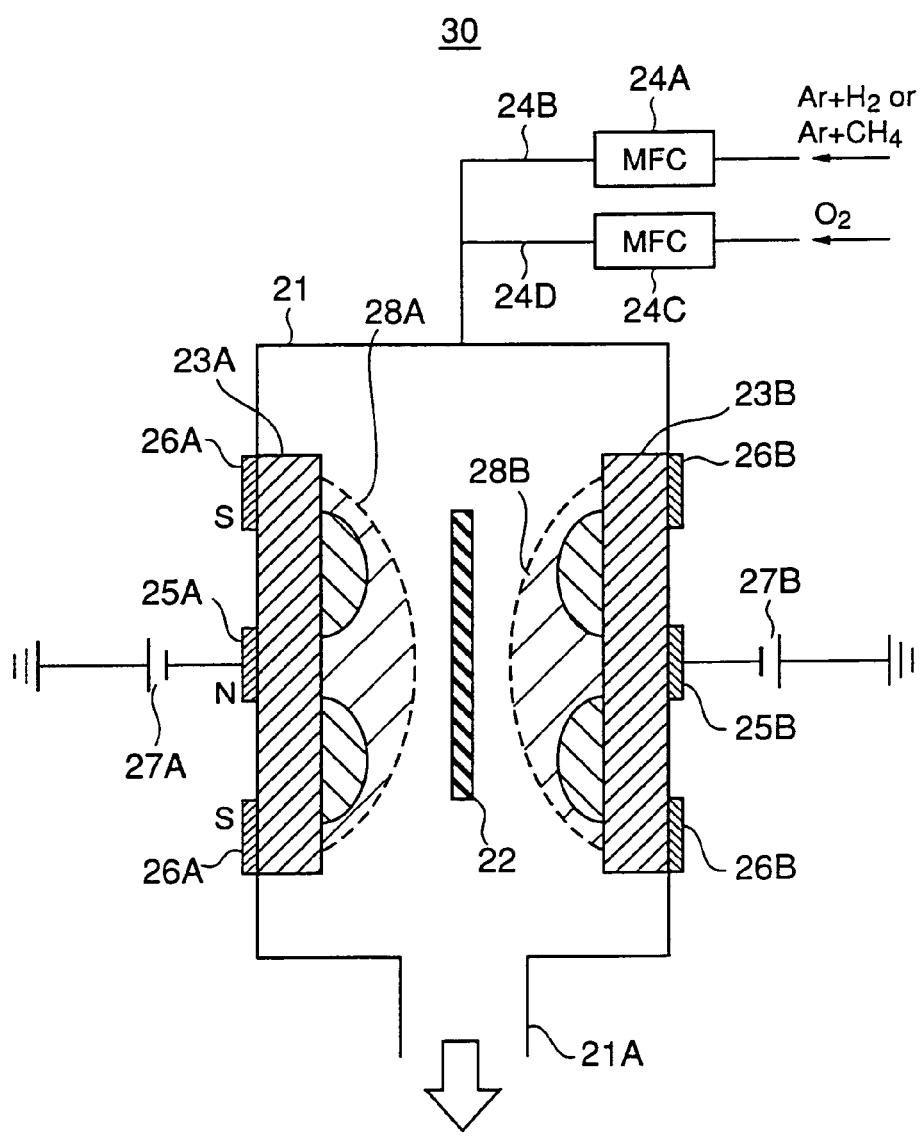
FIG. 5 is a diagram showing the construction of a sputtering apparatus used for producing a magnetic disk according to a first embodiment of the present invention.

FIG. 5 shows the construction of a d.c. magnetron sputtering apparatus 30 used for forming a DLC film in a first embodiment of the present invention, wherein those parts corresponding to the parts described previously are designated by the same reference numerals.

Figure 4:
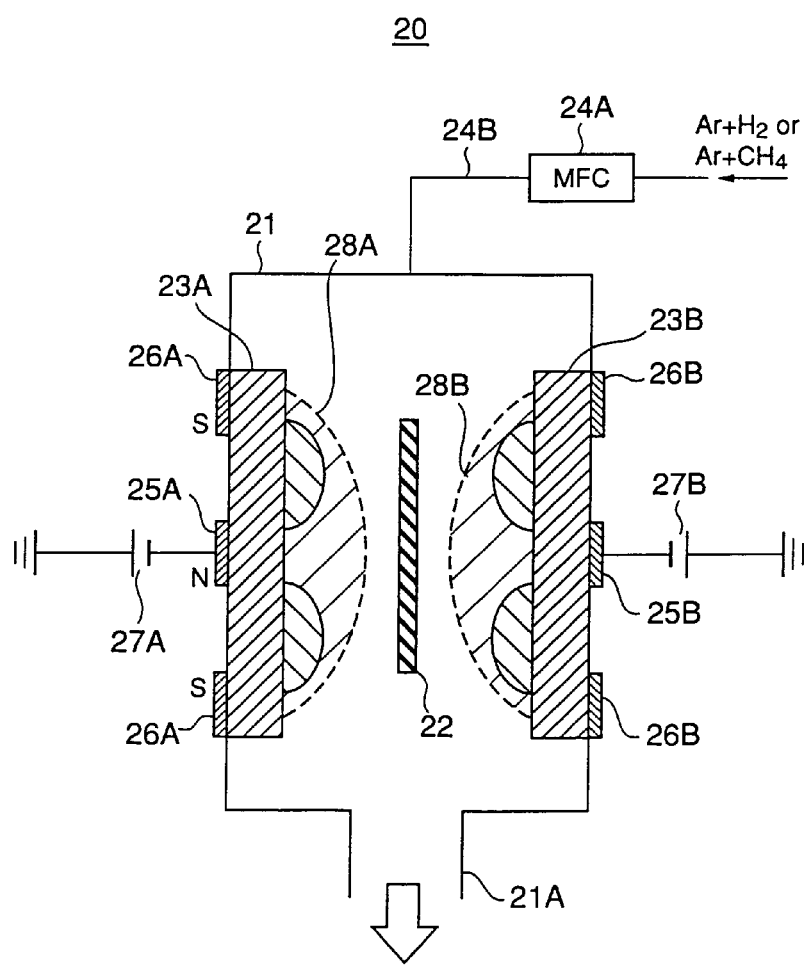
FIG. 4 is a diagram showing the construction of a sputtering apparatus used for producing a magnetic disk according to a related art.

Referring to FIG. 5, the sputtering apparatus 30 has a construction similar to the sputtering apparatus 20 of FIG. 4 except that the sputtering apparatus 30 includes additional mass-flow controller 24C and a line 24D for supplying oxygen into the processing chamber 21.

Thus, by using the sputtering apparatus 30 of FIG. 5, it becomes possible to carry out a sputtering process in a plasma atmosphere containing oxygen radical, wherein the oxygen radical thus formed in the processing chamber 21 immediately reacts with and removes any DLC film or DLC particles that are formed on the surface of the graphite target 23A or 23B in correspondence to the central region thereof where the plasma density is low.

Thus, the problem of charged-up particles causing scattering and contaminating the surface of the substrate 22, on which deposition of a DLC film is to be made, is eliminated, and the yield of production of the magnetic disk is improved.

Figure 6A:
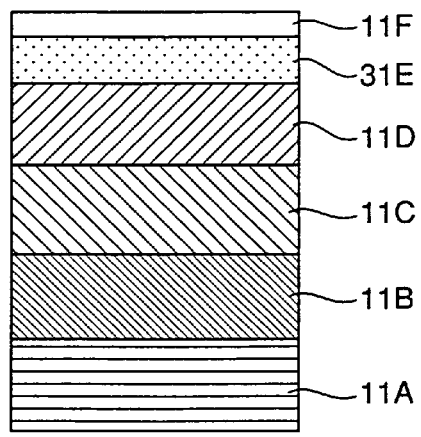
FIGS. 6A and 6B are diagrams showing the construction of a magnetic disk according to the first embodiment of the present invention.

FIG. 6A shows the cross-sectional structure of a magnetic disk 31 formed by the d.c. magnetron sputtering apparatus 30 of FIG. 5, wherein those parts of FIG. 6A explained already with reference to preceding drawings are designated by the same reference numerals and the description thereof will be omitted.

Referring to FIG. 6A, the illustrated structure is obtained when the d.c. sputtering apparatus of FIG. 5 is operated under the condition that the internal pressure of the processing chamber 21 is set to 0.665 Pa (5 mTorr) wherein an Ar gas mixture containing 10% of $CH_4$ is supplied to the processing chamber 21 from the line 24B via the mass-flow controller 24A with a flow-rate of 99 SCCM simultaneously with an oxygen gas, which is supplied from the line 24D via the mass-flow controller 24C with a flow-rate of 1 SCCM. The flow-rate ratio of the gas supplied from the line 24B to the gas supplied from the line 24D can be changed variously within a preferable range.

Figure 3:
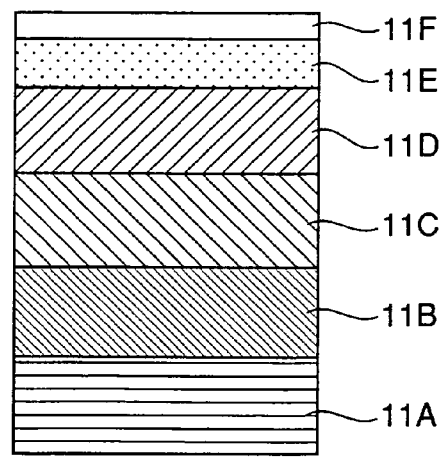
FIG. 3 is a diagram showing the cross-sectional view of a magnetic disk according to a related art.
Figure 6B:
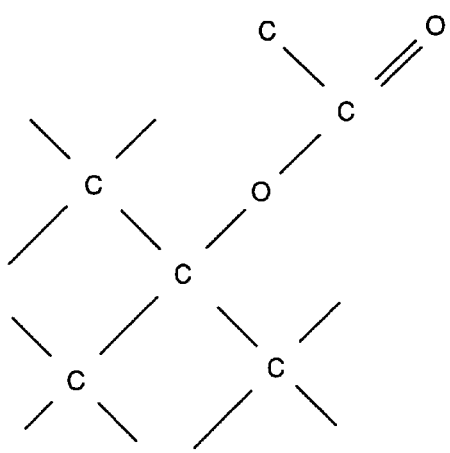

Referring to FIG. 6A, the magnetic disk 31 has a cross-sectional structure similar to the one of the magnetic disk 11 explained with reference to FIG. 3 except that a DLC film 31E having a structure as represented in FIG. 6B is formed in place of the DLC film 11E of FIG. 3. As represented in FIG. 6B, oxygen atoms form an ether bonding or carbonyl bonding with respect to the C atoms in the DLC film 31E.

FIGS. 7A–7D represent the number of arc events per minute during the deposition process of the DLC film 31E in the processing chamber 21 for various gas-flow-rate ratios of the $Ar/CH_4$ mixed gas to the oxygen gas supplied respectively via the lines 24B and 24D. It should be noted that such arc is caused as a result of charge-up of the insulating DLC film formed on the graphite target 23A or 23B and is interpreted as representing the number of DLC particles deposited on the target. Thus, it is interpreted that increase of the arc events indicates an increase of the DLC particles deposited on the target.

Experiment 1 (Comparative Experiment)

Figure 7A:
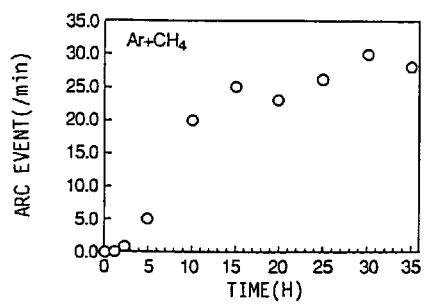
FIGS. 7A–7D are diagrams showing the occurrence of arc events with time during the sputtering process to form a DLC film according to the first embodiment of the present invention.

FIG. 7A shows the observed arc events in the sputtering apparatus 30 of FIG. 5 for the case in which the line 24D is closed. Thus, the experiment of FIG. 7A represents a comparative experiments corresponding to the conventional deposition process of the DLC film 11E conducted by using the sputtering apparatus 20 of FIG. 4. In the experiment of FIG. 7A, the internal pressure of the processing chamber 21 was set to 0.665 Pa as noted before and the deposition was made under the d.c. electric power to 1.5 kW while flowing the $Ar/CH_4$ mixed gas with a flow-rate of 100 SCCM. The deposition was conducted continuously for 36 hours. Under such condition, a deposition rate of 1.99 nm/second was obtained.

Referring to FIG. 7A, it can be seen that occurrence of the arc event is observed already only after 3 hours from the start of the deposition and the number of the arc events per minute increases thereafter with time. The result of FIG. 7A indicates that it is necessary to conduct a cleaning process of the target every two or three hours when the DLC film 11E is to be formed according to the conventional process. Such a frequent cleaning process naturally causes a decrease in the throughput of production of the magnetic disk.

After the experiment of FIG. 7A, the surface resistivity was measured for the targets 23A and 23B and it was indicated that the targets 23A and 23B have a resistivity of $0.7 \times 10^{-2} - 1.0 \times 10^{-2}$ Ωcm in the eroded region thereof. Outside the eroded region, a resistivity exceeding the upper detectable limit value of $2.0 \times 10^5$ Ωcm was observed. This result clearly indicates the existence of an insulating film on the surface of the target.

As a result of the XPS analysis conducted on the DLC film thus formed on the substrate 22, it was confirmed that the DLC film contains oxygen atoms with a ratio of less than 0.0005 with respect to the number of the carbon atoms contained in the DLC film. This result of the XPS analysis indicates that the content of oxygen in the sputtering atmosphere is substantially zero in the experiment of FIG. 7A.

Experiment 2

Figure 7B:
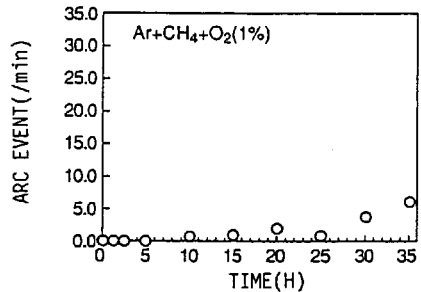

FIG. 7B shows the observed arc events per minute for the experiment in which the deposition of the DLC film 31E is conducted on the substrate 22 under a condition similar to the case of the experiment of FIG. 7A, except that an oxygen gas is supplied to the processing chamber 21 from the line 24D with a flow-rate of 1 SCCM in addition to the mixed gas of $Ar/CH_4$ supplied with a flow-rate of 99 SCCM from the line 24B. Thus, in the experiment of FIG. 7B, the sputtering atmosphere contains 1% of oxygen in terms of flow-rate, and a deposition rate of 1.96 nm/second was obtained for the DLC film 31E on the substrate 22.

Referring to FIG. 7B, it can be seen that occurrence of the arc event is successfully and effectively suppressed as a result of addition of oxygen to the sputtering atmosphere. While a few arc events are recognized after ten hours from the start of the deposition, no appreciable increase of the arc events is observed until 25 hours from the start of the deposition.

The result of FIG. 7B clearly indicates that addition of a small amount of oxygen to the sputtering gas can effectively suppress the formation of insulating deposits, primarily formed of DLC, on the surface of the target 23A or 23B, and the yield of the DLC film 31E on the substrate 22 is improved together with the quality. In the experiment of FIG. 7B, it should be noted that the number of the arc events after 36 hours is only 6 times per minute.

After the experiment of FIG. 7B, the surface resistivity was measured for the targets 23A and 23B and a value of $2.5 \times 10^{-2}$–$2.7 \times 10$ Ωcm was observed for the entire surface region thereof. Further, the XPS analysis of the DLC film 31E on the substrate 22 revealed the existence the oxygen atoms with an atomic ratio of 0.001 with regard to the carbon atoms in the DLC film 31E.

Experiment 3

Figure 7C:
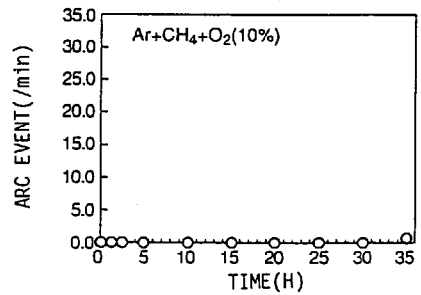

FIG. 7C shows the observed arc events per minute for the experiment in which the deposition of the DLC film 31E is conducted on the substrate 22 under a condition similar to the case of the experiment of FIG. 7A or FIG. 7B, except that an oxygen gas is supplied to the processing chamber 21 from the line 24D with a flow-rate of 10 SCCM in addition to the mixed gas of $Ar/CH_4$ supplied with a flow-rate of 90 SCCM from the line 24B. Thus, in the experiment of FIG. 7C, the sputtering atmosphere contains 10% of oxygen in terms of flow-rate, and a deposition rate of 1.76 nm/second was obtained for the DLC film 31E on the substrate 22.

Referring to FIG. 7C, it can be seen that occurrence of the arc event is successfully and effectively suppressed as a result of addition of oxygen to the sputtering atmosphere. While a few arc events are recognized after 36 hours from the start of the deposition, no arc event was observed at all until 30 hours from the start of the deposition.

The result of FIG. 7C clearly indicates that addition of a small amount of oxygen to the sputtering gas can effectively suppress the formation of insulating deposits, primarily formed of DLC, on the surface of the target 23A or 23B, and the yield of the DLC film 31E on the substrate 22 is improved, together with the quality. In the experiment of FIG. 7C, it should be noted that the number of the arc events after 36 hours is only 0.5 times per minute.

After the experiment of FIG. 7C, the surface resistivity was measured for the targets 23A and 23B and a value of $8 \times 10^{-3}$–$2.5 \times 10^{-2}$ Ωcm was observed for the entire surface region thereof. Further, the XPS analysis of the DLC film 31E on the substrate 22 revealed the existence the oxygen atoms with an atomic ratio of 0.014 with regard to the carbon atoms in the DLC film 31E.

Experiment 4

Figure 7D:
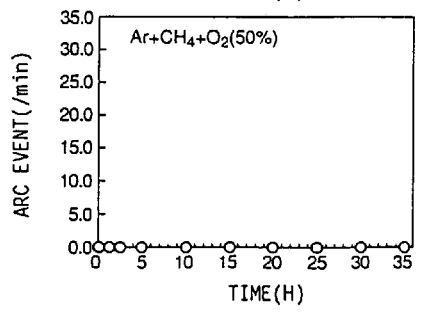

FIG. 7D shows the observed arc events per minute for the experiment in which the deposition of the DLC film 31E is conducted on the substrate 22 under a condition similar to the case of the experiment of FIG. 7A–FIG. 7C, except that an oxygen gas is supplied to the processing chamber 21 from the line 24D with a flow-rate of 50 SCCM in addition to the mixed gas of $Ar/CH_4$ supplied with a flow-rate of 50 SCCM from the line 24B. Thus, in the experiment of FIG. 7D, the sputtering atmosphere contains 50% of oxygen in terms of flow-rate, and a deposition rate of 1.76 nm/second was obtained for the DLC film 31E on the substrate 22.

Referring to FIG. 7D, it can be seen that occurrence of the arc event is successfully and effectively suppressed as a result of addition of oxygen to the sputtering atmosphere, and no arc event was observed at all even after 35 hours from the start of the deposition.

The result of FIG. 7D clearly indicates that addition of oxygen to the sputtering gas up to the proportion of 50% can effectively suppress the formation of insulating deposits, primarily formed of DLC, on the surface of the target 23A or 23B, and the yield of the DLC film 31E on the substrate 22 is improved, together with the quality. In the experiment of FIG. 7D, it should be noted that the number of the arc events after 36 hours is only 0.05 times per minute.

After the experiment of FIG. 7D, the surface resistivity was measured for the targets 23A and 23B and a value of $8 \times 10^{-3}$ Ωcm was observed for the entire surface region thereof. Further, the XPS analysis of the DLC film 31E on the substrate 22 revealed the existence the oxygen atoms with an atomic ratio of 0.07 with regard to the carbon atoms in the DLC film 31E.

Experiment 5 (Comparative Experiment)

Figure 8A:
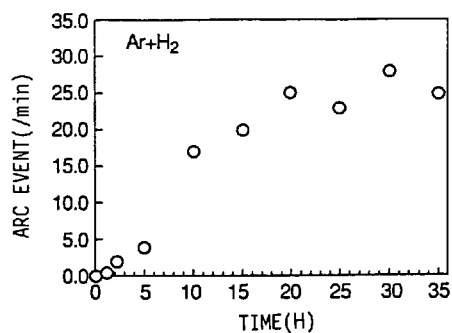
FIGS. 8A–8C are further diagrams showing the occurrence of arc events with time during the sputtering process to form a DLC film according to the first embodiment of the present invention.

FIG. 8A shows the observed arc events in the sputtering apparatus 30 of FIG. 5 for the case in which the line 24D is closed. Thus, the experiment of FIG. 8A represents a comparative experiments corresponding to the conventional deposition process of the DLC film 11E conducted by using the sputtering apparatus 20 of FIG. 4, similarly to the experiment of FIG. 7A. In the experiment of FIG. 8A, the internal pressure of the processing chamber 21 was set to 0.665 Pa as noted before and the deposition was made under the d.c. electric power to 1.5 kW while flowing a mixed gas of $Ar/H_2$ in place of the $Ar/CH_4$ mixed gas such that the $Ar/H_2$ mixed gas contains $H_2$ with a proportion of 20%. The flow rate of the $Ar/H_2$ mixed gas was set to 100 SCCM and the deposition was conducted continuously for 36 hours.

Referring to FIG. 8A, it can be seen that arc events are observed already after only 2 hours from the start of the deposition and that the number of the arc events per minute increases thereafter with time. The result of FIG. 8A indicates that it is necessary to conduct a cleaning process of the target every two or three hours when the DLC film 11E is to be formed according to the process of FIG. 8A. Such a frequent cleaning process naturally causes a decrease in the throughput of the production of the magnetic disk.

After the experiment of FIG. 8A, the surface resistivity was measured for the targets 23A and 23B and it was indicated that the targets 23A and 23B have a resistivity of 0.7×10$^{-3}$–1.3×10$^{-2}$ Ωcm in the eroded region thereof. Outside the eroded region, a resistivity exceeding the upper detectable limit of 2.0×10$^5$ Ωcm was observed. This result indicates the existence of insulating film on the surface of the target.

Experiment 6

Figure 8B:
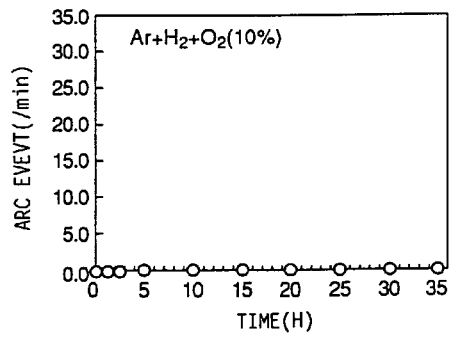

FIG. 8B shows the observed arc events per minute for the experiment in which the deposition of the DLC film 31E is conducted on the substrate 22 under a condition similar to the case of the experiment of FIG. 8A, except that an oxygen gas is supplied to the processing chamber 21 from the line 24D with a flow-rate of 10 SCCM in addition to the mixed gas of Ar/H$_2$ supplied with a flow-rate of 90 SCCM from the line 24B. Thus, in the experiment of FIG. 8B, the sputtering atmosphere contains 10% of oxygen in terms of flow-rate.

Referring to FIG. 8B, it can be seen that occurrence of the arc event is successfully and effectively suppressed as a result of addition of oxygen to the sputtering atmosphere, and the occurrence of the arc event is only about 0.2 times/minute after 35 hours from the start of the deposition.

The result of FIG. 8B clearly indicates that addition of a small amount of oxygen to the sputtering gas can effectively suppress the formation of insulating deposits, primarily formed of DLC, on the surface of the target 23A or 23B, and the yield of the DLC film 31E on the substrate 22 is improved together with the quality.

After the experiment of FIG. 8B, the surface resistivity was measured for the targets 23A and 23B and a value of 6×10$^{-3}$–1.6×10$^{-2}$ Ωcm was observed for the entire surface region thereof. Further, the XPS analysis of the DLC film 31E on the substrate 22 revealed the existence the oxygen atoms with an atomic ratio of 0.01 with regard to the carbon atoms in the DLC film 31E.

Experiment 7

Figure 8C:
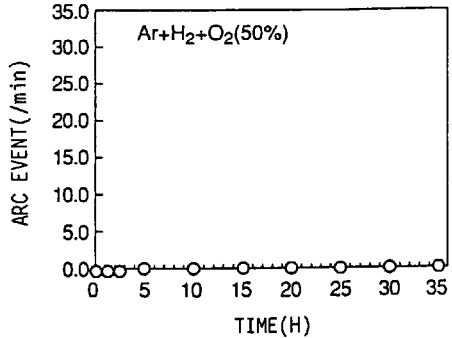

FIG. 8C shows the observed arc events per minute for the experiment in which the deposition of the DLC film 31E is conducted on the substrate 22 under a condition similar to the case of the experiment of FIGS. 8A and 8B, except that an oxygen gas is supplied to the processing chamber 21 from the line 24D with a flow-rate of 50 SCCM in addition to the mixed gas of Ar/H$_2$ supplied with a flow-rate of 50 SCCM from the line 24B. Thus, in the experiment of FIG. 8C, the sputtering atmosphere contains 50% of oxygen in terms of flow-rate.

Referring to FIG. 8C, it can be seen that occurrence of the arc event is successfully and effectively suppressed as a result of addition of oxygen to the sputtering atmosphere, and the occurrence of the arc event is only about 0.09 times/minute after 36 hours from the start of the deposition.

The result of FIG. 8C clearly indicates that addition of a small amount of oxygen to the sputtering gas can effectively suppress the formation of insulating deposits, primarily formed of DLC, on the surface of the target 23A or 23B, and the yield of the DLC film 31E on the substrate 22 is improved together with the quality.

After the experiment of FIG. 8C, the surface resistivity was measured for the targets 23A and 23B and a value of 6×10$^{-3}$–1.0×10$^{-2}$ Ωcm was observed for the entire surface region thereof. Further, the XPS analysis of the DLC film 31E on the substrate 22 revealed the existence the oxygen atoms with an atomic ratio of 0.04 with regard to the carbon atoms in the DLC film 31E.

The result of the experiments 1–4 explained before also indicates a decrease of the deposition rate of the DLC film 11E or 31E formed on the substrate 22 with increasing oxygen content in the sputtering atmosphere. It is believed that this tendency is caused as a result of the oxidation of the DLC film formed on the substrate 22. A similar tendency was confirmed also in the experiments 5–7.

Figure 9:
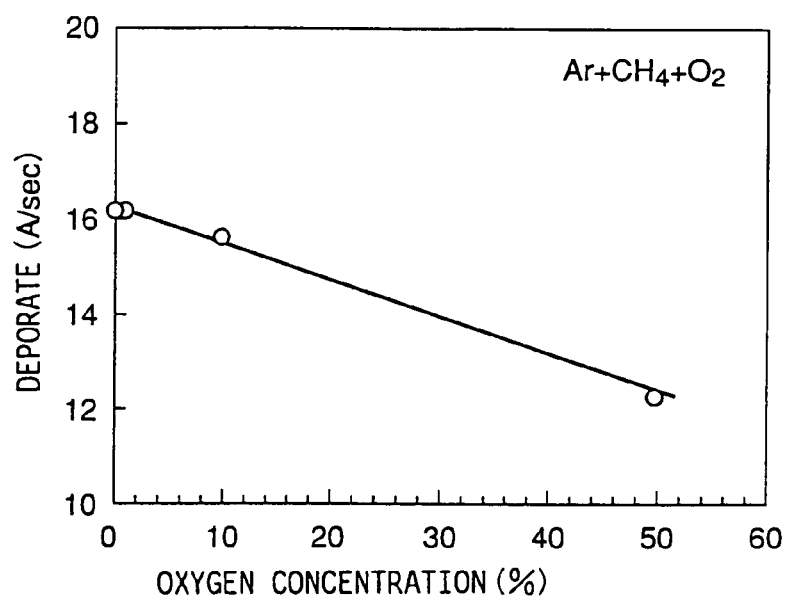
FIG. 9 is a diagram showing the relationship between the deposition rate of a DLC film and oxygen concentration in the sputtering atmosphere according to the first embodiment of the present invention.

FIG. 9 shows the relationship between the rate of the DLC film on the substrate 22 and the oxygen concentration of the sputtering gas, wherein the experiment of FIG. 9 was conducted under a condition slightly different from the condition of the experiments 1–4.

Referring to FIG. 9, it can be seen that the deposition rate of the DLC film decreases generally linearly with the oxygen concentration in the sputtering gas from the initial value of about 1.6 nm/second to the value of 1.3 nm/second or less in the case the sputtering gas contains oxygen with a proportion of 50%. From the relationship of FIG. 9, it is concluded that the preferable oxygen concentration in the sputtering gas does not exceed 50% in the case a gas mixture of Ar/CH$_4$ is used for the sputtering gas.

FIG. 10 shows the relationship between the deposition rate and the oxygen concentration in the sputtering gas corresponding to the experiments 5–7 explained before, wherein the experiment of FIG. 10 is conducted under a condition slightly difference from the condition of the experiments 5–7.

Figure 10:
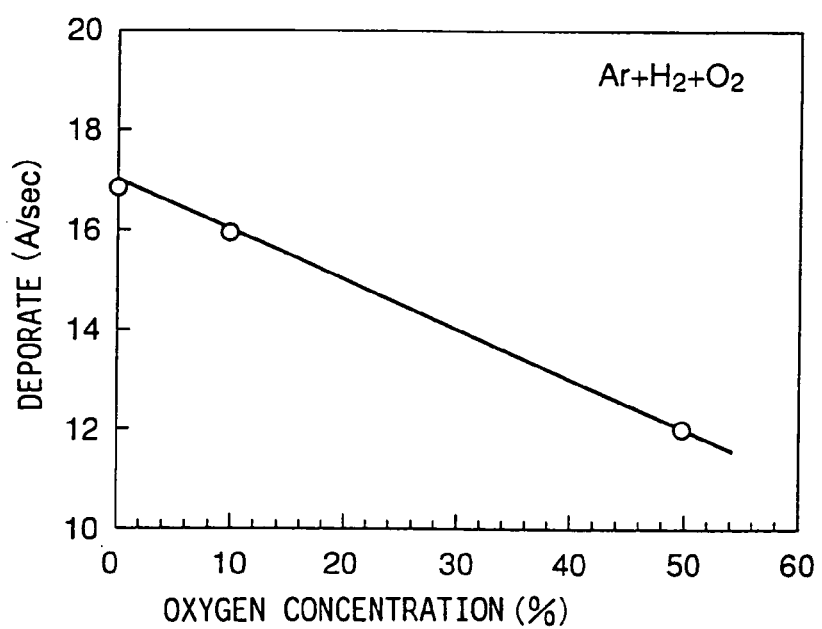
FIG. 10 is another diagram showing the relationship between the deposition rate of a DLC film and oxygen concentration in the sputtering atmosphere according to the first embodiment of the present invention.

Referring to FIG. 10, it can be seen that the deposition rate of the DLC film decreases generally linearly with the oxygen concentration in the sputtering gas from the initial value of about 1.7 nm/second to the value of about 1.2 nm/second in the case the sputtering gas contains oxygen with a proportion of 50%. From the relationship of FIG. 10, it is concluded that the preferable oxygen concentration in the sputtering gas does not exceed 50% also in the case a gas mixture of Ar/H$_2$ is used for the sputtering gas.

On the other hand, the requirement to guarantee no arc occurrence during the process of growing a DLC film to have a thickness of 20 nm, in other words the requirement to guarantee that the frequency of occurrence of the arc event is less than once in ten seconds during the sputtering process of the DLC film, imposes a condition that the oxygen concentration in the sputtering gas should be at least equal to or larger than 1% in any of the Ar/CH$_4$ mixture or Ar/H$_2$ mixture.

Meanwhile, the process of forming the DLC film 31E by a sputtering process conducted in an atmosphere containing oxygen as proposed in the present invention involves a step of causing the magnetic film on the magnetic disk to make a contact with the sputtering gas containing oxygen. Thus, there arises a concern that the performance of the magnetic film of the magnetic disk may be degraded as a result of such an exposure of the magnetic film to the sputtering gas containing oxygen. Thus, the inventor of the present invention has conducted an investigation with regard to the effect of oxygen in the sputtering gas on the magnetization of the magnetic film 11D on the magnetic disk 11.

Figure 11:
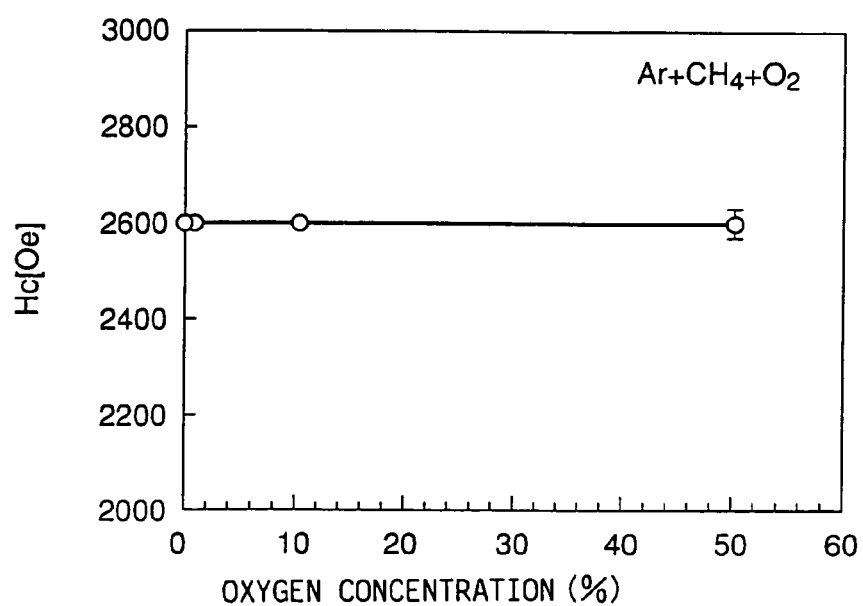
FIG. 11 is a diagram showing the relationship between the magnetization of a magnetic film and oxygen concentration in the sputtering atmosphere used for forming a DLC film according to the first embodiment of the present invention.

FIG. 11 shows the magnetization of the magnetic film 11D for the case in which the DLC film 31E of FIG. 6A is formed in the sputtering gas of the Ar/CH$_4$ mixture added with various amounts of oxygen (O$_2$).

Referring to FIG. 11, it can be seen that the magnetization of the magnetic film 11E underneath the DLC film 31E is substantially constant irrespective of the oxygen concentration in the sputtering gas and takes a value of about 2600 Oe (205400 A/m) as long as the oxygen concentration is in the range between 0% and 50%.

Figure 12:
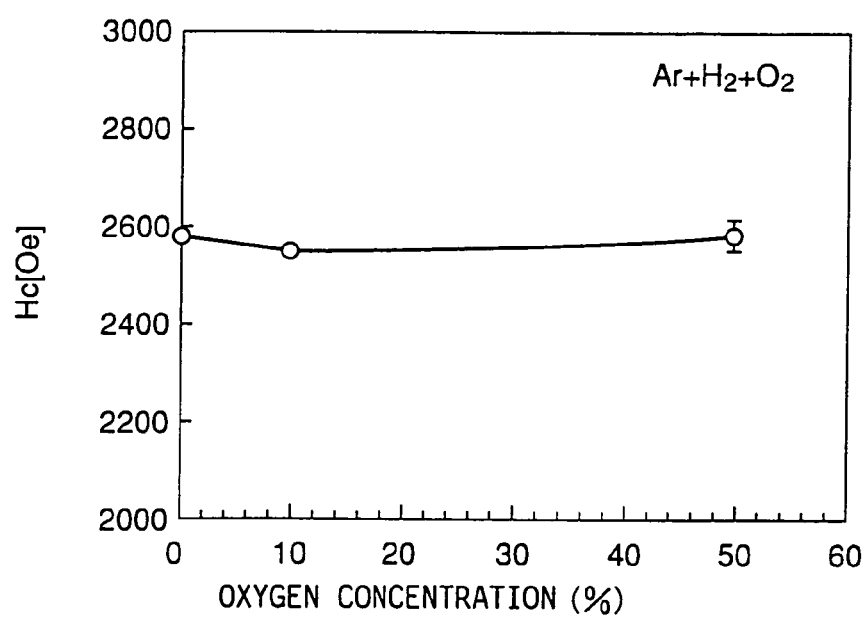
FIG. 12 is a diagram showing the relationship between the magnetization of a magnetic film and oxygen concentration in the sputtering atmosphere used for forming a DLC film according to the first embodiment of the present invention.

FIG. 12 shows the magnetization of the magnetic film 11D in the case the DLC film 31E is formed in a sputtering gas of the Ar/H$_2$ gas mixture containing various amounts of oxygen.

Again, FIG. 12 shows that no substantial change of magnetization occurs even when the oxygen concentration in the sputtering gas is changed variously within the range of 0–50%.

Figure 13:
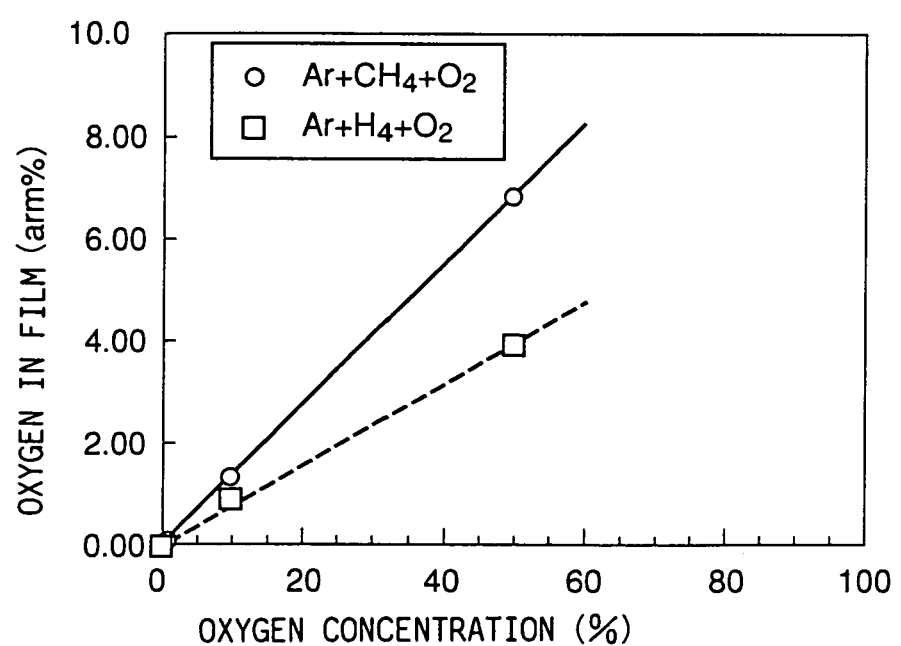
FIG. 13 is a diagram showing the relationship between the oxygen concentration level in a DLC film and the oxygen content in the sputtering atmosphere used for forming the DLC film according to the first embodiment of the present invention.

FIG. 13 shows the relationship between the oxygen concentration in the sputtering atmosphere and the oxygen concentration in the DLC film 31E thus formed as a result of the sputtering, wherein the oxygen concentration in the DLC film 31E is represented in terms of the ratio of the oxygen atoms to the carbon atoms constituting the DLC film 31E.

Referring to FIG. 13, it can be seen that the oxygen concentration in the DLC film 31E increases generally linearly with increasing oxygen concentration in the DLC film 31E, although there is a slight difference in the rate of increase between the case the oxygen gas is added to the Ar/CH$_4$ gas mixture and the case the oxygen gas is added to the Ar/H$_2$ mixture. As noted previously, the DLC film 31E contains oxygen atom with a concentration of 0.1 atomic percent in the case the oxygen concentration in the Ar/CH$_4$ sputtering gas is about 1%. In the case the oxygen concentration in the Ar/CH$_4$ mixed sputtering gas is 50%, the DLC film 31E contains oxygen atoms with a concentration of about 7 atomic percent.

In the case the Ar/H$_2$ mixed gas is used for the sputtering gas, the DLC film 31E contains about 0.1 atomic percent of oxygen atoms when the DLC film 31E is formed in the sputtering gas atmosphere containing 1% of oxygen, while the DLC film 31E contains oxygen with a concentration of about 4 atomic percent when the DLC film 31E is formed in the sputtering gas atmosphere containing 50% of oxygen.

In the present embodiment, it is also possible to use other oxygen source such as NO or NO$_2$ in place of the O$_2$ gas for supplying oxygen to the sputtering atmosphere. When such a gas containing nitrogen in addition to oxygen is used, the DLC film 31E thus formed contains nitrogen atoms in addition to the oxygen atoms.

Figure 1:
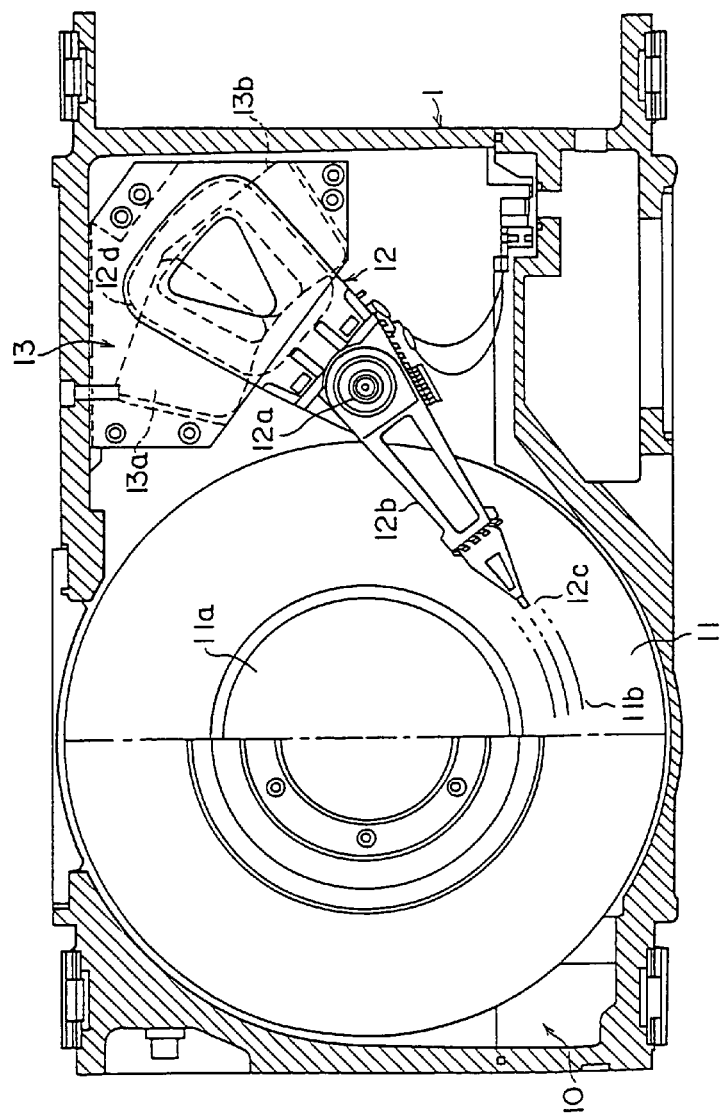
FIG. 1 is a diagram showing the construction of a magnetic disk drive according to a related art.
Figure 2:
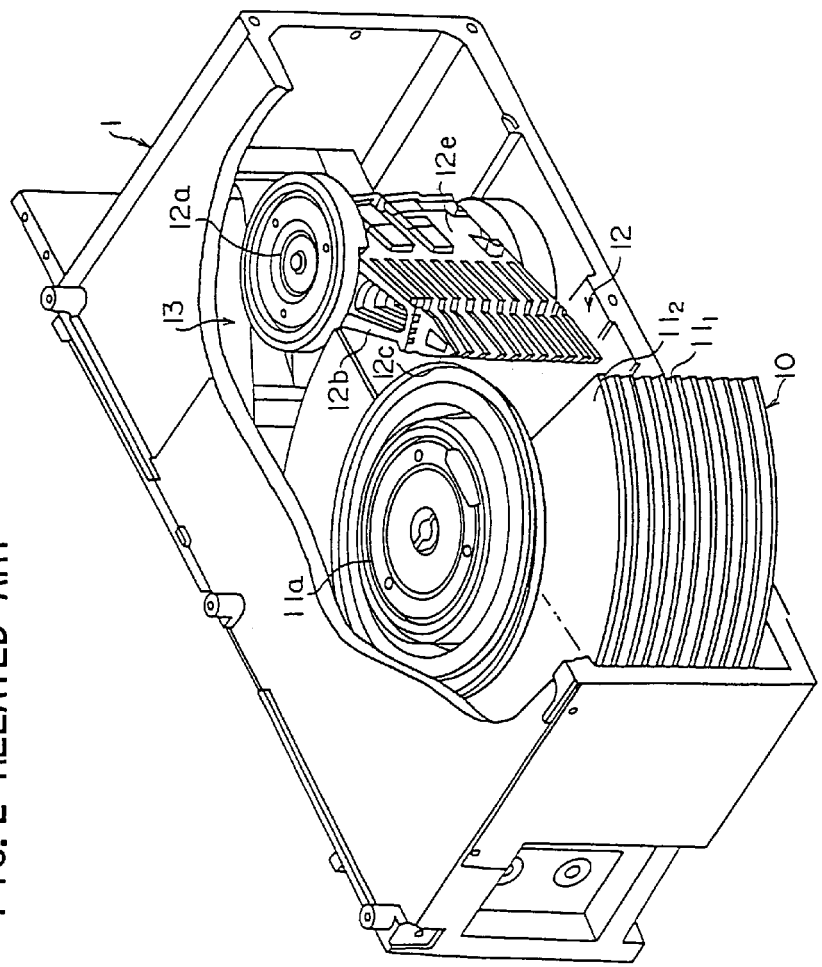
FIG. 2 is another diagram showing the construction of the magnetic disk drive of FIG. 1.

By using the magnetic disk 31 of FIG. 6A in the magnetic disk drive of FIG. 1, it becomes possible to produce the magnetic disk drive with reduced cost and improved yield.

SECOND EMBODIMENT

Figure 14:
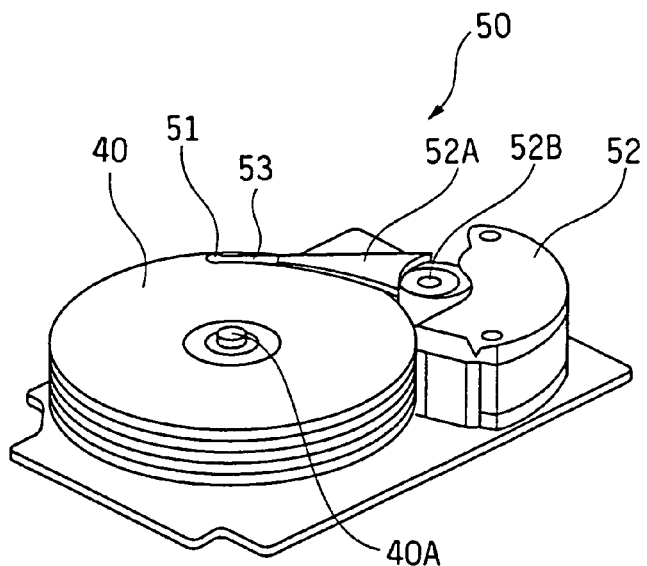
FIG. 14 is a diagram showing the construction of a magnetic disk drive according to a second embodiment of the present invention in an oblique view.

FIG. 14 shows the construction of a magnetic disk drive 50 according to a second embodiment of the present invention.

Referring to FIG. 14, the magnetic disk drive 50 is a so-called hard disk drive and includes a magnetic disk 40 rotated by a rotary hub 40A and an arm 52A provided adjacent to the magnetic disk 40, wherein the arm 52A is driven by a voice coil motor 52 about a rotary shaft 52B and scans the surface of the magnetic disk 40 generally in the radial direction thereof. The swing arm 52A carries a slider 53 at a tip end part thereof and the slider 53 carries a magnetic head 51 thereon. The magnetic disk drive 50 having such a construction is accommodated in a closed enclosure. In the illustrated example, a number of the magnetic disks 40 are mounted on the hub 40A coaxially.

Figure 15:
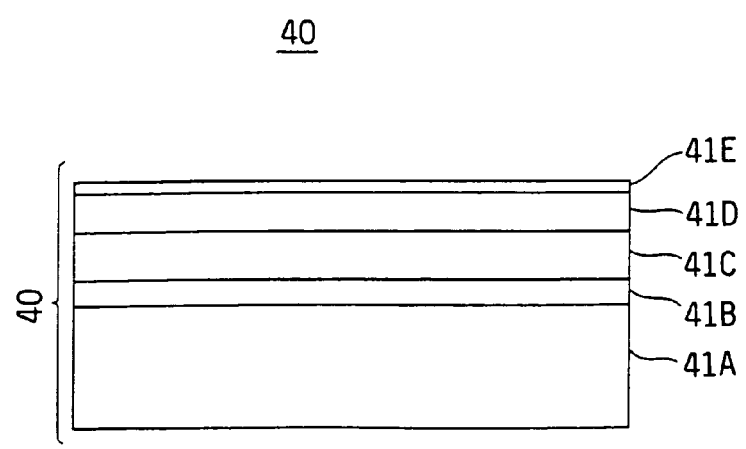
FIG. 15 is a diagram showing the construction of a magnetic disk used in the magnetic disk drive of FIG. 14 according to the second embodiment of the present invention in a cross-sectional view.

FIG. 15 shows the cross-sectional structure of the magnetic disk 40.

Referring to FIG. 15, the magnetic disk 40 has a construction similar to that of the magnetic disk 31 of FIG. 6A and includes a disk substrate 41A typically of Al, a foundation layer 41B of NiP formed on the disk substrate 41A, a magnetic film 41C formed on the foundation layer 41B and a hard carbon protective film 41D formed on the magnetic film 41C for protecting the magnetic film 41C, wherein the DLC film 31E explained before with reference to the previous embodiment may be used for the hard carbon film 41D. Alternately, the hard carbon film 41D may be formed of a DLC film deposited by a CVD process typically with a thickness of less than 8 nm.

In the magnetic disk 40 of FIG. 15, it should be noted that the hard carbon protective film 41D is further covered by a lubricating film 41E, wherein the lubricating film 41E is formed of a fluorocarbon resin preferably containing a polar group such as OH.

In the present embodiment, it should be noted that the lubricating film 41E is formed of a fluorocarbon resin having an photocrosslinking functional group containing 2–30 carbon atoms such as alkenyl group, alkyl halide group, aryl halide group, aryl azide group, piperonyl group, epoxy group, and the like, as the endcap group at the end or side chain of the resin skeleton.

The molecules constituting the lubricating film and containing such a functional group are crosslinked as a result of irradiation of optical radiation (far-ultraviolet radiation) having a wavelength corresponding to the absorption wavelength of the functional group. As a result of such an photocrosslinking reaction, the proportion of the non-crosslinked molecules, which form the mobile layer in the lubricating film 41E, is reduced and the problem of the lubricating film 41E increases the thickness at the peripheral part of the magnetic disk is eliminated.

It is preferable that the resin constituting the lubricating film 41E has a fluorocarbon skeleton, particularly a perfluoro-polyether skeleton, and the foregoing photocrosslinking functional group is introduced to the end or side chain of the skeleton. Thereby, it is preferable that the resin constituting the lubricating film 41E has an average molecular weight, represented in terms of the molecular weight of polymethyl methacrylate in gel-permeation chromatography, of 1200 or more, preferably 2000 or more.

The wavelength of the optical radiation used for causing the desired crosslinking changes depending on the functional group used. In the case a chloromethylphenylethyl group is used for the photocrosslinking functional group, an ArF excimer radiation of the wavelength of 193 nm can be used for causing the photocrosslinking. In the event a piperonyl group is used, a Xe$_2$ excimer radiation having a wavelength of 172 nm can be used. Further, a F$_2$ excimer radiation having a wavelength of 157 nm can be used when a vinyl group is used for the photocrosslinking functional group.

It should be noted that these excimer radiation has a very sharp spectrum characterized by a half-height width of 15 nm or less, and the desired photocrosslinking reaction can be induced efficiently.

Generally, it is possible to use any of KrF, ArF, XeCl, KrCl, Xe$_2$, F$_2$, Kr and Ar excimer radiation depending on the optical absorption wavelength or photochemical reaction mechanism of the photocrosslinking functional group.

It should be noted that the foregoing promotion of the crosslinking reaction in the lubricating film 41E can be achieved not only by the irradiation of the far-ultraviolet radiation but also by irradiation of electron beam or X-ray. In this case, it is possible to use alkenyl group or aryl halide group for the photocrosslinking functional group.

As will be explained with reference to other embodiment, the crosslinking reaction can be promoted by applying a heat treatment at the temperature of 30–300° C., preferably 80–150° C., at the time of the photocrosslinking reaction. When the photocrosslinking reaction is conducted at the temperature lower than the foregoing temperature range, the effect of crosslinking becomes insufficient, while the magnetic performance of the magnetic film 41C may be deteriorated when the crosslinking reaction is conducted at the temperature higher than the foregoing preferable range.

During such an photocrosslinking reaction conducted in the elevated temperature environment, it is preferable to suppress the oxygen content in the atmosphere to be less than about 10 ppm, preferably less than about 1 ppm, in order to suppress the effect of ozone oxidation and to promote pure crosslinking reaction.

By controlling the atmosphere of the photocrosslinking reaction, a hydrophobic surface characterized by a contact angle of 100° or more with respect to water is obtained for the lubricating film 41E. When the contact angle is smaller than 100°, there appears a tendency that the a large water droplet is formed on the surface of the lubricating film 41E when the magnetic disk drive is used in a high temperature and high humidity environment, while such a large water droplet causes the problem of contamination or corrosion of the magnetic head.

Figure 16A:
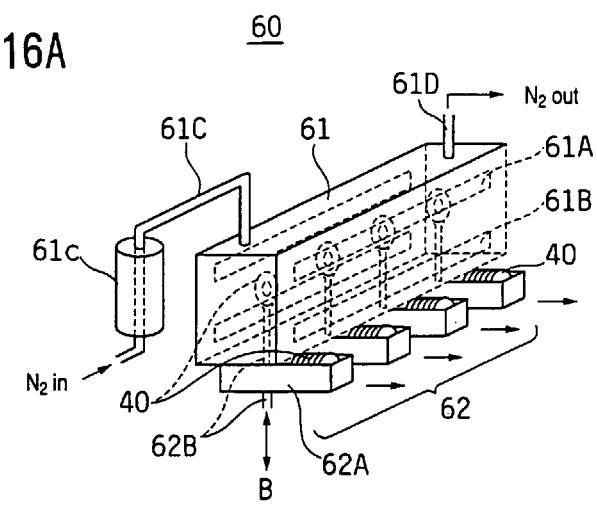
FIGS. 16A–16C are diagrams showing the construction of an apparatus used for causing a photocrosslinking reaction in a lubricating film provided on a magnetic disk according to the second embodiment of the present invention.
Figure 16B:
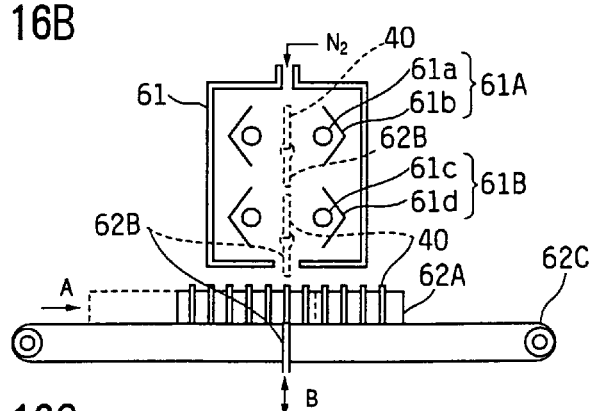
Figure 16C:
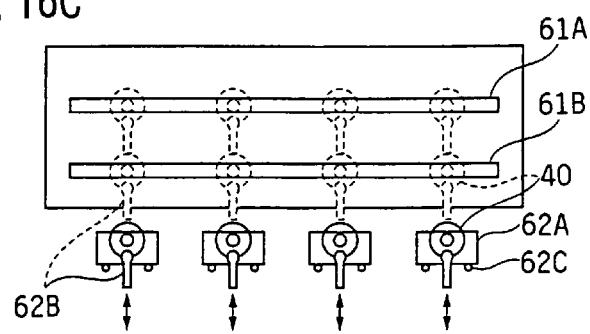

FIGS. 16A–16C show the construction of an apparatus 60 used in the present invention for carrying out the photocrosslinking reaction of the lubricating film 41E, wherein FIG. 16A shows an oblique view, FIG. 16B shows a side view and FIG. 16C shows a front view.

Referring to FIG. 16A, the reaction apparatus includes a reaction chamber 61 in which the photocrosslinking reaction is carried out and a transport system 62 transporting the magnetic disks 40 of FIG. 15 to and away from the reaction chamber 61. The transport system 62 includes a cassette 62A accommodating the magnetic disks 40 to be processed, wherein the cassette 62A transports the magnetic disks 40 in the direction represented in FIG. 16A by an arrow A in the state that the magnetic disks 40 are accommodated in the cassette 62A.

Further, it should be noted that the transport system 62 includes a number of arms 62B adapted to hold the magnetic disks 40 in the cassette 62A in such a manner that each arm 62B is movable in the direction represented by an arrow B. Thereby, the magnetic disk 40 held on the arm 62B is inserted into the reaction chamber 61 as the arm 62B is moved toward the reaction chamber 61 in the direction B. Thus, the magnetic disks 40 held in the cassette 62 are inserted into the reaction chamber 61 one by one by the arm 62B as the cassette 62 is moved in the direction A.

It should be noted that the reaction chamber 61 has a laterally elongated shape and thus, the reaction chamber 61 can process a plurality of magnetic disks 40 in parallel. The reaction chamber 61 is equipped with an optical source 61A of the far-ultraviolet radiation used to cause the photocrosslinking reaction in the lubricating film 41E formed on the surface of the magnetic disk 40 and an infrared optical source 61B for facilitating the photocrosslinking reaction. Each of the far-ultraviolet optical source 61A and the infarared optical source 61B extends laterally in the elongating direction of the reaction chamber 61.

In operation, the reaction chamber 61 is supplied with a nitrogen gas from an inlet line 61C having a temperature regulator for controlling the temperature of the nitrogen gas to be supplied to the reaction chamber 61. The nitrogen gas thus introduced via the line 61C fills the reaction chamber 61 and is exhausted from an outlet line 62B, wherein the atmosphere in the reaction chamber 61 is controlled as a result of filling of the reaction chamber 61 by the nitrogen gas such that the oxygen concentration in the reaction chamber 61 is below about 10 ppm.

Referring to FIGS. 16B and 16C, the cassette 62A is moved in the direction A by a belt-conveyer mechanism 62C and the arm 62B is inserted into the cassette 62A from the lower side of the belt-conveyer mechanism in the upward direction. As the arm 62B is lifted in the upward direction, the arm 62B holds a magnetic disk 40 in the cassette 62A and lifts the disk 40 further in the upward direction into the reaction chamber 61.

In the reaction chamber 61, it should be noted that the far-ultraviolet radiation source 61A includes a far-ultraviolet lamp 61a such as an excimer lamp and a cooperating reflector 61b, while the infrared radiation source 61B includes an infrared lamp 61c and a cooperating reflector 61d. In the construction of FIGS. 16A–16C, the infrared radiation source 61B is disposed underneath the far-ultraviolet radiation source 61A and heats the magnetic disk 40 held by the arm 62B to a desired temperature prior to the crosslinking processing conducted by the far-ultraviolet radiation source 61A.

As can be seen from the side view of FIG. 16B, the far-ultraviolet radiation source 61A and the infrared radiation source 61B are provided in the processing chamber 41 so as to irradiate the topside and bottom side of the magnetic disk 40 by the far-ultraviolet radiation and the infrared radiation. A commercially available excimer lamp such as model UER-200-172 supplied by Ushio Electric Co., Ltd. can be used for the far-ultraviolet radiation source 61A, wherein the foregoing excimer lamp can emit a far-ultraviolet radiation of the wavelength of 172 nm with a half-height width of 14 nm. In the illustrated example, the far-ultraviolet radiation source 61A is disposed with a separation of about 5 mm from the surface of the magnetic disk 40. By using the far-ultraviolet radiation source 61A, it becomes possible to conduct irradiation of the far-ultraviolet radiation to the surface of the magnetic disk 40 within a variation of 15% in the case the magnetic disk 40 is a 3.5-inch magnetic disk.

Next, experiments of the photocrosslinking reaction conducted by the apparatus of FIGS. 16A–16C will be explained below.

Experiment 8

In this experiment, the magnetic disk 40 having a structure as represented in FIG. 15 is formed by using an Al disk as the substrate 41A, wherein the substrate 41A is covered with the foundation layer 41B of NiP by conducting a plating process. The surface of the NiP film 41B thus formed is then subjected to a polishing process such that the NiP film 41B has a surface roughness Ra of about 6.5 nm. Further, the magnetic film 41C is formed by depositing a Cr film or a CoCrTa film on the NiP film 41B by a d.c. magnetron sputtering process conducted in an Ar atmosphere, and a DLC film is deposited on the magnetic film 41C by a CVD process as the hard carbon protective layer 41D with a thickness of about 8 nm.

After the magnetic disk 40 is thus prepared, the lubricating film 41E is formed on the protective film 41D by coating a perfluoro polyether film having a piperonyl group at the end of the resin skeleton, wherein the magnetic disk 40 thus formed with the lubricating film 41E is introduced into the reaction chamber 61 of the processing apparatus of FIGS. 16A–16C for photocrosslinking reaction of the lubricating film 41E.

In the reaction chamber 41, there is formed a nitrogen atmosphere controlled such that the oxygen content in the nitrogen atmosphere is less than about 10 ppm, and the magnetic disk 40 is exposed to the far-ultraviolet radiation of the wavelength of 172 nm produced by a Xe$_2$ excimer lamp, which is used for the far-ultraviolet radiation source 61a, at room temperature with a dose of 800 mJ/cm$^2$ for a duration of about 100 seconds.

After the foregoing photocrosslinking reaction, the thickness of the lubricating film 41E was measured, and the magnetic disk 40 thus processed was further immersed into a solvent (FC-77 of 3M) so as to dissolve the unreacted mobile layer into the solvent. After the foregoing treatment in the solvent, the thickness of the lubricating film 41E was again measured.

As a result of the measurement conducted after the treatment in the solvent, it was found that the initial thickness of 1.4 nm of the lubricating film 41E is decreased slightly to 1.38 nm, indicating that the bonding ratio, defined as a ratio of thickness of the lubricating film before and after the solvent treatment, is 98.5% for the lubricating form of the present experiment. The foregoing bonding ratio corresponds to the gel ratio of the lubricating film 41E.

Experiment 9

In this experiment, a magnetic disk carrying a perfluoro polyether lubricating film having the piperonyl group at the end of the resin skeleton similar to the one used in the previous experiment is used for the magnetic disk 40 and the photocrosslinking reaction is conducted in the reaction chamber 41 by using a nitrogen atmosphere containing oxygen with a concentration of 10 ppm or less.

In the experiment, the infrared radiation source 62B is activated so that the temperature of the magnetic disk 40 is elevated to 120° C., and the photocrosslinking reaction was conducted by exposing the lubricating film 41E of the magnetic disk 40 to the far-ultraviolet radiation of the wavelength of 172 nm from the far-ultraviolet radiation source 62A for a duration of 20 seconds with a dose of 160 mJ/cm$^2$.

The lubricating film 41E of the magnetic disk 40 thus processed showed the bond ratio of 99.2%.

Experiment 10

In this experiment, the magnetic disk 40 having a structure as represented in FIG. 15 is formed by using an Al disk as the substrate 41A, wherein the substrate 41A is covered with the foundation layer 41B of NiP by conducting a plating process. The surface of the NiP film 41B thus formed is then subjected to a polishing process such that the NiP film 41B has a surface roughness Ra of about 6.5 nm. Further, the magnetic film 41C is formed by depositing a Cr film and a CoCrTa film consecutively on the NiP film 41B by a d.c. magnetron sputtering process conducted in an Ar atmosphere with respective thicknesses of 50 nm and 40 nm, and a DLC film is deposited on the magnetic film 41C by a CVD process as the hard carbon protective layer 41D with a thickness of about 8 nm.

After the magnetic disk 40 is thus prepared, the lubricating film 41E is formed on the protective film 41D by coating a perfluoro polyether film having a chloromethylphenyl group at the end of the resin skeleton by a spin coating process with a thickness of about 2.5 nm, wherein the magnetic disk 40 thus formed with the lubricating film 41E is introduced into the reaction chamber 61 of the processing apparatus of FIGS. 16A–16C for photocrosslinking reaction of the lubricating film 41E.

In the reaction chamber 41, there is formed a nitrogen atmosphere controlled such that the oxygen content in the nitrogen atmosphere is less than about 10 ppm, and the magnetic disk 40 is exposed to the far-ultraviolet radiation of the wavelength of 193 nm produced by an ArF excimer lamp, which is used for the far-ultraviolet radiation source 61a, at room temperature with a dose of 100 mJ/cm$^2$ for a duration of about 100 seconds.

After the foregoing photocrosslinking reaction, the thickness of the lubricating film 41E was measured, and the magnetic disk 40 thus processed is immersed into a solvent (FC-77 of 3M) so as to dissolve the unreacted mobile layer into the solvent. After the foregoing treatment in the solvent, the thickness of the lubricating film 41E was again measured.

As a result of the measurement conducted after the treatment in the solvent, it was observed that the bonding ratio is 97.1% for the lubricating form of the present experiment.

Experiment 11 (Comparative Experiment)

In this comparative experiment, the process of exposure to the far-ultraviolet radiation was omitted in the Experiment 8. It turned out that the bond ratio of the lubricating film 41E thus obtained as a result of the comparative experiment is only 38%, indicating that mote than half of the lubricating film 41E is a mobile layer.

Experiment 12 (Comparative Experiment)

In this comparative experiment, the piperonyl endcap group terminating the perfluoro polyether resin skeleton in the Experiment 8 is replaced with a CF$_3$ group. It turned out that the bond ratio of the lubricating film 41E thus obtained is only 65% even in the case exposure to the far-ultraviolet radiation of 172 nm wavelength is conducted.

Experiment 13 (Comparative Experiment)

In this experiment, the photocrosslinking reaction of the Experiment 8 is conducted by using a low-pressure mercury lamp for the far-ultraviolet radiation source 62A in place of the excimer lamp. In this case, a bonding ratio of only 60% was attained.

Experiment 14 (Comparative Experiment)

In this experiment, the photocrosslinking reaction of the Experiment 9 is conducted by using a deuterium lamp having a central wavelength of 160 nm and a half-height width of 30 nm for the far-ultraviolet radiation source 62A in place of the excimer lamp. In this case, a bonding ratio of only 80% was attained. Further, it was necessary to carry out the exposure over a duration four times as large as in the case of the Experiment 8 for achieving the foregoing bonding ratio.

Experiment 15

In this experiment, the exposure dose of the far-ultraviolet radiation and the atmosphere of the photocrosslinking reaction are changed variously and the contact angle to water and the friction coefficient were obtained. The result of this experiment is summarized in TABLE I.

TABLE I

| exp. dose (mJ/cm2) | atmosphere | bonding ratio (%) | wetting angle | friction coeff (μs) |
|---|---|---|---|---|
| 100 | N$_2$ | 78.2 | 114 | 0.9 |
| 300 | N$_2$ | 85.5 | 116 | 0.7 |
| 800 | N$_2$ | 98.5 | 116 | 0.5 |
| 100 | air | 75.2 | 48 | 3.2 |
| 300 | air | 92.3 | 21 | 3.6 |
| 800 | air | 90.0 | 4 | 3.9 |
| none | | 40.0 | 90 | 2.0 |

In the foregoing experiment, the friction coefficient of the lubricating film 41E was obtained with regard to a thin-film magnetic head having a slider of a sintered body of alumina and TIC for the state in which the magnetic disk is activated from a stationary stat to a rotational speed of 1 r.p.m. under the condition that the magnetic head is applied with a load of 1.5 gf (0.0147 N). The friction coefficient was thereby measured by using a disk abrasion tester.

As can be seen from TABLE I, there occurs a decrease of the bonding ratio with decreasing exposure dose of the far-ultraviolet radiation, while it can also be seen that a bonding ratio exceeding 98% can be realized by employing an exposure dose of 800 mJ/cm2 or more in the nitrogen atmosphere. The lubricating film 41E thus formed has additional advantageous features of large contact angle to water and very small friction coefficient of 0.5.

In the case the foregoing photocrosslinking reaction is conducted in the air, on the other hand, it can be seen that the water contact angle becomes very small, indicating that the lubricating film 41E has a hydrophilic surface. Further, the friction coefficient is increased substantially.

Experiment 16

Next, examination was made with regard to the contact-start-stop cycles for various magnetic disks produced according to the process of the Experiment 8 but with various exposure doses of the far-ultraviolet radiation in the photocrosslinking process conducted in the nitrogen atmosphere.

In the experiment, the same thin-film magnetic head used in the Experiment 15 was used, and the contact-start-stop experiment was made by repeatedly driving the magnetic disk 40 in the magnetic disk drive 50 of FIG. 14 at the rotational speed of 3600 r.p.m. for 15 seconds and by stopping the magnetic disk 40 for 15 seconds. During the driving phase the magnetic disk 40, the magnetic head was floated from the surface of the lubricating film 41E of the magnetic disk 40 by a distance of 0.1 μm. In the experiment, the number of the contact-start-stop cycles until the friction coefficient reaches 0.6 was obtained. TABLE II below summarizes the result of the experiments.

TABLE II

| exp. dose (mJ/cm2) | atmosphere | number of CSS cycles when friction coeff. reached 0.6 |
|---|---|---|
| 100 | N2 | 20,000 |
| 300 | N2 | 25,000 |
| 1000 | N2 | 30,000 |
| none | — | 7,000 |

The result of TABLE II indicates that the friction coefficient of 0.6 is reached within 7000 cycles when no photocrosslinking of the lubricating film 41E was made and that contact-start-stop cycles of 30,000 is possible when the photocrosslinking reaction was conducted in the $N_2$ atmosphere under the exposure dose of 1000 mJ/cm$^2$ Third Embodiment Next, a third embodiment of the present invention will be described.

In an investigation that constitutes a foundation of the present invention, the inventor has discovered that the adhesion of the lubricating film to the surface of the magnetic disk is improved substantially when a non-polar group is introduced as an end cap group rather than using conventional polar groups such as oxoacid group, hydroxyl group, ester group, ether group, carboxyl group or formyl group for the end gap group, and that then electrons of the nonpolar group contributes to the improvement of the lubricating film substantially.

A typical example of the non-polar end cap group of the present embodiment is a triorganosilyl group. In view of the general tendency that the long-term stability of the resin becomes deteriorated when the triorganosilyl group undergoes hydrolysis or dehydration condensation due to the existence of alkoxyl group in the triorganosilyl group, it is required that the triorganosilyl group constituting the endcap group in the fluorocarbon resin of the present embodiment has to be chosen from those that do not cause hydrolysis or dehydration condensation.

The triorganosilyl group of the present embodiment has a general formula represented as

(4)

wherein $R^1$, $R^2$ and $R^3$ represent commonly or independently any of an alkyl group, an alkenyl group, an aryl group, an alkenyl group, including those substituted with halogen or nitrogen.

For the alkyl group, those having 1–20 carbon atoms, such as methyl group, ethyl group, propyl group, butyl group, hexyl group, octyl group, dodecyl group, and the like can be used. For the alkenyl group, those having 2–20 carbon atoms, such as vinyl group, allyl group, isopropenyl group, butenyl group, and the like. For the aryl group, those having 6–30 carbon atoms such as phenyl group, naphtyl group, anthryl group, and the like. For the aralkyl group, those having 7–30 carbon atoms such as benzyl group, diphenylmethyl group, phenylethyl group, and the like can be used.

As noted previously, the inventor of the present invention has discovered that π electrons in the endcap group of the fluorocarbon resin skeleton perform important contribution to the adherence of the lubricating film to the underlying magnetic disk surface. Thus, it is preferable that at least one of the foregoing substitution groups $R^1$, $R^2$ and $R_3$ has π electrons. Larger than the number of the π electrons, stronger the adherence of the lubricating film to the underlying surface. In view of availability of the material, it is preferable to use phenyl group or benzyl group for the foregoing groups $R^1$, $R^2$ and $R^3$.

In the event an alkyl group free from the π electrons is used for the substitution groups $R^1$, $R^2$ and $R^3$, it is possible to improve the adherence by applying heat or radiation to the lubrication film formed on the magnetic disk surface.

Another typical example of the non-polar endcap group used in the present embodiment has eight or more π electrons and represented by a general formula

(5)

wherein $R^4$, $R^5$ and $R^6$ represent commonly or independently a hydrogen atom or an organic group, and wherein at least one of the groups $R^4$, $R^5$ and $R^6$ represent an organic group. The organic group may be selected from any of an alkyl group, an alkenyl group, an aryl group, and an aralkyl group, including those substituted with halogen or nitrogen, and at least one of the organic group has a π electron. Thereby, the total number of the π electrons in the endcap groups is 8 or more, preferably 14 or more. For the alkyl group, it is possible to use those having 1–20 carbon atoms such as methyl group, ethyl group, propyl group, butyl group, hexyl group, octyl group, dodecyl group, and the like. For the alkenyl group, it is possible to use those having 2–20 carbon atoms such as vinyl group, allyl group, isopropenyl group, butenyl group, and the like. For the aryl group, it is possible to use those having 6–30 carbon atoms such as phenyl group, naphtyl group, anthryl group, and the like. For the alkyl group, it is possible to use those having 7–30 carbon atoms such as benzyl group, diphenylmethyl group, phenylethyl group, and the like. Larger the number of the π electrons in the endcap group, stronger the adherence of the lubricating film to the magnetic disk surface. Thus, it is preferable to use phenyl group, benzyl group, naphtyl group or anthryl group for the substitute groups R4, R5 and R6, provided that the total number of the π electrons in the endcap groups is eight or more.

Thus, the lubricating film of the present invention uses non-polar endcap groups contrary to conventional lubricating film that uses polar endcap groups such as oxoacid group, hydroxyl group, ester group, ether group, carboxyl group, formyl group, and the like. In view of absence of polarity in the endcap group, the lubricating film of the present invention can successfully avoid the problem of coagulation of the fluorocarbon resin, which is caused as a result of the action of the polar endcap group. Further, it should be noted that, in the lubricating film of the present invention, the π electrons in the endcap group improves adherence of the lubricating film to an underlying hard carbon protective film, particularly a DLC film, without introducing the polar group.

Although not limited, it is preferable that the fluorocarbon resin has a skeleton formed of carbon atoms or a skeleton formed of carbon atoms and containing oxygen atoms, wherein fluorine atoms are bonded to the carbon skeleton in such a fluorocarbon resin.

While the fluorocarbon resin may contain other various atoms such as hydrogen atoms, chlorine atoms, alkyl groups having 1–5 carbon atoms, and the like bonded to the resin skeleton, it is preferable that the proportion of the fluorine atoms in the atoms bonded to the carbon skeleton is equal to or larger than 50%. In the present invention, it is preferable to use a fluorine resin having a perfluoro skeleton or a perfluoroether skeleton, wherein the resin having a perfluoroether skeleton is most preferable. While the skeleton of a fluorocarbon resin, including the resin used in the present invention, generally makes a bonding with an endcap group via an oxygen atom, the present invention also includes a fluorocarbon resin that makes bonding with an endcap group directly, without intervening an oxygen atom.

Thus, the fluorocarbon resin of the present invention can be generally represented as

E-O-A-O-E             (6)

or

E-A-E                 (7)

wherein E represents the endcap group while A represents the resin skeleton. O represents the oxygen atom.

Further, the present invention can also use a resin having the endcap group at only one end of the resin skeleton or a resin having the endcap group at a branched end.

In order to avoid loss of film thickness caused as a result of evaporation, and further in view of avoiding the wear of the film, the resin forming the lubricating film of the present invention should have a molecular weight falling in a range between 500–10,000, preferably 1,000–5,000, more preferably 2,000–3,000.

The fluorocarbon resin of the present invention can be produced easily by causing a fluorocarbon resin having a reactive group, such as hydroxyl (OH) group, at the end of the resin skeleton to react with a substance having a desired group to be used for the endcap group. For example, a fluorocarbon resin having a triorganosilyl endcap group represented by Eq.(1) or (4) can be produced by causing a silyization reaction in the fluorocarbon resin having a hydroxyl end group by a compound that has the desired group to be used for the endcap group, such as chlorosilanes, silylamines, silylamides, and the like. In this case, a solvent having one or both of a CH bond and a CCl bond and further a CF bond is used to dissolve the fluorocarbon resin having a hydroxyl endcap group and an amine catalyst to cause a desired sililyzation together with the tri-organo chlorosilane. The solvent used for such a purpose may be a mixture of 1,1-dichloro-2,2,3,3,3-pentafuluoropropane and 1,1,2,2,3-pentafluoroether. Alternatively, a compound supplied from 3M under the trade name of HFE (hydrofluorother) or a compound supplied from Japan Zeon under the tradename of Zeorora. For the amine catalyst, it is possible to use triethylamine, pyridine, and the like. Further, the fluorocarbon resin having the formula of Eq.(5) can be produced also easily by carrying out a dehydrating condensation reaction of the fluorocarbon resin having a hydroxyl endcap group with a material having the desired organic group for the endcap group under existence of an acid catalyst.

The lubricating film of the present embodiment thus produced is applied upon the surface of the magnetic disk in the form dissolved in a suitable solvent together with necessary additives or surfactants. The application of the lubricating film may be achieved by various processes such as dip-coating process or spin-coating process. It is preferable that the surface of the magnetic disk, on which the lubricating film of the present embodiment is applied, is covered with a DLC film, including the one described in the preceding embodiment.

In a high-density magnetic disk drive, a DLC film may be formed by a CVD process with a thickness of 8 nm or less for reducing the distance between a magnetic film formed underneath the DLC film and a magnetic head scanning the surface of the magnetic disk. By using a CVD process, it is possible to reduce the thickness of the DLC film, while the magnetic disk having such an extremely thin DLC film shows the tendency of metal migration of the magnetic material forming the magnetic film. The lubricating film of the present embodiment shows a particularly strong adherence when formed on such a very thin DLC film and covers the surface of the DLC film uniformly. Thus, the lubricating film effectively insulates the magnetic disk from various contaminants originating from moisture coagulation and the reliability and resistance against corrosion of the magnetic disk drive is improved substantially.

In the as-formed state, the lubricating film formed on the DLC film contains a substantial amount of mobile layer not bonded to the surface of the DLC film. As noted previously, such a mobile layer tends to cause a problem of lateral displacement and accumulation at the peripheral part of the magnetic disk with high-speed rotation of the magnetic disk. In the lubricating film of the present embodiment, the proportion of such a mobile layer can be reduced substantially by applying radiation and/or heat so as to facilitate crosslinking in the fluorocarbon resin constituting the lubricating film. Such a crosslinking process induced by optical radiation or heating is particularly effective for reducing the mobile component in the lubricating film of the present embodiment.

Figure 17:
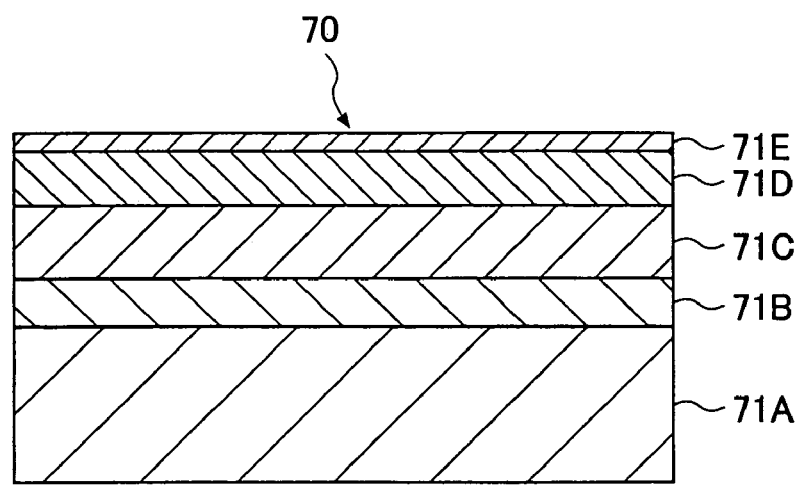
FIG. 17 is a diagram showing the construction of a magnetic disk according to a third embodiment of the present invention in a cross-sectional view.

Hereinafter, experiments conducted by the inventor of the present invention with regard to the lubricating film of the present embodiment will be explained with reference to FIG. 17 showing a magnetic disk 70.

Referring to FIG. 17, the magnetic disk 70 is constructed on a disk substrate 71A of Al or a glass, wherein the substrate 71A carries thereon a foundation layer 71B of NiP or NiAl. The foundation layer 71B is subjected to a texture processing and has a surface roughness Ra of about 5 nm, and a magnetic film 71C of Co, Co or a CoCr alloy is formed on the foundation layer 71B thus processed. Further, a protective film 71D of DLC or $SiO_2$ is formed on the magnetic film 71C, and a lubricating film 71E of the present embodiment is formed on the protective film 71D. In view of description with regard to the structure of the magnetic disk provided previously with preceding embodiments, further description thereof will be omitted.

Experiment 17

In this experiment, the fluorocarbon resin used for the lubricating film of 71E of the present invention was produced.

In this experiment, a four-neck flask fitted with a condenser, a tube for $N_2$ bubbling, a stirring rod and an addition funnel, was charged with perfluoro polyether having a hydroxyl endcap group, together with an equivalent-weight mixed solution of 1,1-dichloro-2,2,3,3,3-pentafluoro propane and 1,3-dichloro-1,1,2,2,3-pentafluoro propane (AK-225 of Asahi Glass, and anhydrous pyridine was added further with an amount triple times in moles with respect to the endcap hydroxyl group. The mixture thus formed was then stirred at 50° C. in the flask while bubbling $N_2$, and triphenyl chlorosilane (Tph) diluted with the AK-225 solution of twice the amount of Tph, was added from the addition funnel such that the amount of Tph becomes triple times the amount of the endcap hydroxyl group in the flask. After the addition of Tph, a silyization reaction was caused in the flask by continuing stirring for four hours at 70° C.

After the silyzation process, rinsing was conducted in water until the solution becomes neutral. Further, the solution was rinsed twice by butyl acetate, and the solvent was removed by evaporation in a rotary evaporator. Further, filtration was made by using a 0.1 μm membrane filter and the sample thus obtained was subjected to an NMR analysis. As a result of the NMR analysis, it was indicated that 98% of the hydroxyl group of the perfluoro polyether was silyized.

Experiment 18

A fluorocarbon resin was produced similarly to the Experiment 17, except that triphenyl chlorosilane (TPh) was replaced with tribenzyl chlorosilane (TBz), allyldimethyl chlorosilane (ADM), dimethylvinyl chlorosilane (DMV), trivinyl chlorosilane (TVn), diphenylvinyl chlorosilane (DPV), and triethyl chlorosilane (TEt). As a result of the NMR analysis, it was indicated that more than 95% of the hydroxyl group was silyized for all of these resins.

Experiment 19

In order to evaluate the high-temperature resistance of the fluorocarbon resin of the present embodiment, a thermogravimetric analysis was conducted for each of the seven resins obtained in the Experiments 17 and 18 explained before. The experiment was made in a nitrogen atmosphere while increasing the temperature at the rate of 20° C./min. TABLE III below summarizes the observed weight loss for each of the resin specimens, wherein the resin specimens are identified in TABLE III by the endcap group such as TPh, TBz . . . .

TABLE III

| | resin | temperature of 5% weight loss (° C.) |
|---|---|---|
| | TPh | 390 |
| | TBz | 360 |
| | DPv | 365 |
| | ADM | 330 |
| | DMV | 320 |
| | TVn | 332 |
| | TEt | 331 |
| compar. expt. | OH | 300 |

Experiment 20

In this experiment, the seven fluorocarbon resins produced by the Experiments 17 and 18 are applied to the magnetic disk 70 of FIG. 17 in the form of the lubricating film 71E.

More specifically, the lubricating film 71E is formed by dipping the magnetic disk 70 of FIG. 17 into a solution of the fluorocarbon resin in which the fluorocarbon resin is dissolved in a solution (FC-77 solution of Simitomo 3M Co, Ltd.) in the state that the magnetic disk 70 lacks the lubricating film 71E.

For the sake of comparison, a similar magnetic disk coated with a fluorocarbon resin having the hydroxyl group as the endcap group was also prepared.

In the experiment, the thickness of the lubricating film 71E was measured by an infrared absorption spectroscopy for the as-formed state, and the magnetic disk thus formed with the lubricating film 71E was dipped in the foregoing FC-77 solvent so as to dissolve any mobile layer not bonded to the magnetic disk 70.

After the dipping process, the magnetic disk was pulled up from the solvent and the thickness of the lubricating film 71E was again measured by the infrared absorption spectroscopy. By dividing the thickness of the lubricating film 71E after the dipping process into the solvent by the initial thickness, the bonding ratio was obtained.

Further, a similar measurement was conducted also for the bonding ratio with regard to the magnetic disk 70 for the case the lubricating film 71E is subjected to an exposure process to an optical radiation produced by a low-pressure mercury lamp for 5 seconds before the magnetic disk is dipped into the solvent for removal of the mobile layer.

TABLE IV below summarizes the bonding ratio thus obtained for the various magnetic disk specimens having various fluorocarbon resins for the lubricating film 71E. Similarly to TABLE III, TABLE IV identifies the fluorocarbon resin in terms of the endcap group. Further, TABLE IV also indicates the number of π electrons included in the endcap group.

TABLE IV

| resin | bond ratio (no exposure) | bond ratio (with exposure) | π electrons |
|---|---|---|---|
| TPh | 57% | 60% | 18 |
| TBz | 58% | 65% | 18 |
| DPV | 45% | 55% | 14 |
| ADM | 37% | 48% | 2 |
| DMV | 40% | 48% | 2 |
| TMn | 34% | 48% | 6 |
| TEt | 30% | 52% | 0 |
| OH | 35% | 42% | 0 |

Experiment 21

In the present experiment, a contact-start-stop operation test was made for a magnetic disk drive that uses the magnetic disk 70 of FIG. 17 for the case the lubricating film 41E is formed of TPh. The magnetic disk 70 was prepared similarly to the Experiment 20 except that the magnetic film 41C was formed in the form of consecutive stacking of a Cr film and a CoCrTa film with respective thicknesses of 50 nm and 40 nm.

In the contact-start-stop experiment, the magnetic disk thus prepared and carrying the fluorocarbon lubricating film 41E with a thickness of 2.5 nm was mounted on a magnetic disk drive, and the surface of the lubricating film 41E was scanned by a magnetic head having a slider of a sintered body of alumina and TiC. During the high-speed rotation phase of the magnetic disk, the magnetic head was floated over the magnetic disk with a separation of 0.1 µm between the top surface of the lubricating film 41E and the slider surface. The contact-start-stop experiment was conducted by repeating the stationary phase of the magnetic disk in which the magnetic disk is stationary and the high-speed rotation phase in which the magnetic disk is rotating at the speed of 3600 r.p.m., wherein the stationary phase and the high-speed rotation phase were repeated alternately, each with 15 seconds. In the experiment, the number of the contact-start-stop cycles was evaluated TABLE V summarizes the result of the contact-start-stop experiments noted above, wherein TABLE V represents the number of the cycles the until the friction coefficient reaches the value of 0.6. For the sake of comparison, TABLE V also represents the number of the contact-start-stop experiments for the case the fluorocarbon lubricating film 71E contains OH as the endcap group.

From TABLE V, it can be seen that the number of the contact-start-stop cycles is increased substantially by using the lubricating film 71E of the present embodiment.

Further, the present invention is not limited to the embodiments described heretofore, but various variations and modifications may be made without departing from the scope of the invention.

What is claimed is:

1. A method of making a magnetic disk, comprising the steps of:
    coating a disk surface with a lubricating layer comprising molecules having a photocrosslinking functional group;
    causing a crosslinking in said molecules by applying an optical radiation to said lubricating layer,
    wherein said step of causing said crosslinking is conducted by applying a substantially monochromatic far-ultraviolet radiation with a wavelength corresponding to an absorption wavelength of said photocrosslinking functional group as said optical radiation such that a bonding ratio is 85.5% or more in said coated lubricating layer,
    wherein said lubricating layer is excited optically in an ambient containing oxygen with a concentration of 10 ppm or less,
    wherein said far-ultraviolet radiation has a half-height width of 15 nm or less by a $Xe_2$ excimer radiation having a wavelength of 172 nm,
    wherein a source of said far-ultraviolet radiation is disposed with a separation distance of about 5 nm from said disk surface.

2. A method as claimed in claim 1, wherein said photocrosslinking functional group is selected from the group consisting of: an alkenyl group, an alkenyl halide group, an aryl halide group, an aryl azide group, piperonyl group and epoxy group.

3. A method as claimed in claim 1, wherein said step of causing said crosslinking is conducted while applying heat to said lubricating layer.

4. A method as claimed in claim 1, wherein said lubricating layer is formed of a resin having a molecular weight of 1200 or more in terms of the molecular weight of polystyrene.

5. The method as claimed in claim 1, wherein exposure of said lubricating layer to said far-ultraviolet radiation is conducted such that a contact angle of 116 degrees or more is achieved for water on said lubricating layer.

6. The method as claimed in claim 1, wherein said lubricating layer has a thickness of 2.5 nm or less.

7. The method as claimed in claim 1, wherein said photocrosslinking functional group comprises a $CF_3$ group.

8. A method of making a magnetic disk, comprising the steps of:
    coating a disk surface with a lubricating layer comprising molecules having a photocrosslinking functional group; and
    causing a crosslinking in said molecules by applying an optical radiation to said lubricating layer;
    wherein said step of causing said crosslinking is conducted by applying a substantially monochromatic far-ultraviolet radiation with a wavelength corresponding to an absorption wavelength of said photocrosslinking functional group as said optical radiation such that a bonding ratio is 85.5% or more in said coated lubricating layer;
    wherein there is provided a carbon film having a thickness of 8 nm or less as an underlayer of said lubricating layer provided underneath said lubricating layer,
    wherein said lubricating layer is excited optically in an ambient containing oxygen with a concentration of 10 ppm or less,
    wherein said far-ultraviolet radiation has a half-height width of 15 nm or less by a $Xe_2$ excimer radiation having a wavelength of 172 nm,
    wherein a source of said far-ultraviolet radiation is disposed with a separation distance of about 5 nm from said disk surface.

9. A method as claimed in claim 8, wherein said photocrosslinking functional group is selected from the group consisting of: an alkenyl group, an alkenyl halide group, an aryl halide group, an aryle azide group, piperonyl group, and epoxy group.

10. A method as claimed in claim 8, wherein said step of causing said crosslinking is conducted while applying heat to said lubricating layer.

11. A method as claimed in claim 8, wherein said lubricating layer is formed of a resin having a molecular weight of 1200 or more in terms of the molecular weight of polystyrene.

12. The method as claimed in claim 8, wherein said lubricating layer has a thickness of 2.5 nm or less.

13. The method as claimed in claim 8, wherein said photocrosslinking functional groupcomprises a $CF_3$ group.

14. A method of making a magnetic disk, comprising the steps of:

coating a disk surface with a lubricating layer comprising molecules having a photocrosslinking functional group;

causing a crosslinking in said molecules by applying an optical radiation to said lubricating layer; and dipping said lubricating layer in a solvent;

wherein said step of causing said crosslinking is conducted by applying a substantially monochromatic far-ultraviolet radiation with a wavelength corresponding to an absorption wavelength of said photocrosslinking functional group as said optical radiation such that a bonding ratio is 85.5% or more in said coated lubricating layer, wherein there is provided a carbon film having a thickness of 8 nm or less as an underlayer of said lubricating layer provided underneath said lubricating layer, wherein said lubricating layer is excited optically in an ambient containing oxygen with a concentration of 10 ppm or less, wherein said far-ultraviolet radiation has a half-height width of 15 nm or less by a $Xe_2$ excimer radiation having a wavelength of 172 nm, wherein a source of said far-ultraviolet radiation is disposed with a separation distance of about 5 nm from said disk surface.

15. A method as claimed in claim 14, wherein said photocrosslinking functional group is selected from the group consisting of: an alkenyl group, an alkenyl halide group, an aryl halide group, an aryl azide group, piperonyl group and epoxy group.

16. A method as claimed in claim 14, wherein said step of causing said crosslinking is conducted while applying heat to said lubricating layer.

17. A method as claimed in claim 14, wherein said lubricating layer is formed of a resin having a molecular weight of 1200 or more in terms of the molecular weight of polystyrene.

18. The method as claimed in claim 14, wherein said lubricating layer has a thickness of 2.5 nm or less.

19. The method as claimed in claim 14, wherein said photocrosslinking functional group comprises a $CF_3$ group.

* * * * *

UNITED STATES PATENT AND TRADEMARK OFFICE
CERTIFICATE OF CORRECTION

PATENT NO. : 7,081,277 B1  Page 1 of 1
APPLICATION NO. : 09/692569
DATED : July 25, 2006
INVENTOR(S) : Watanabe et al.

It is certified that error appears in the above-identified patent and that said Letters Patent is hereby corrected as shown below:

<u>On the Patent Face</u>:

Delete the existing title and insert the following title:

--MAGNETIC DISK WITH CROSSLINKED LUBRICANT LAYER AND METHOD OF MAKING THEREOF--.

Signed and Sealed this

Nineteenth Day of December, 2006

JON W. DUDAS
*Director of the United States Patent and Trademark Office*